(12) United States Patent
Beall et al.

(10) Patent No.: US 10,398,060 B1
(45) Date of Patent: Aug. 27, 2019

(54) DISCRETE COOLING MODULE

(71) Applicant: Amazon Technologies, Inc., Reno, NV (US)

(72) Inventors: Christopher Strickland Beall, Woodinville, WA (US); David Edward Bryan, Seattle, WA (US); Darin Lee Frink, Seattle, WA (US); Jason Alexander Harland, Seattle, WA (US)

(73) Assignee: Amazon technologies, Inc., Reno, NV (US)

( * ) Notice: Subject to any disclaimer, the term of this patent is extended or adjusted under 35 U.S.C. 154(b) by 189 days.

(21) Appl. No.: 14/217,124

(22) Filed: Mar. 17, 2014

(51) Int. Cl.
*H05K 7/14* (2006.01)
*H05K 7/20* (2006.01)

(52) U.S. Cl.
CPC ....... *H05K 7/20736* (2013.01); *H05K 7/1488* (2013.01)

(58) Field of Classification Search
CPC .......... H05K 7/20709; H05K 7/20745; H05K 7/20718; H05K 7/20727; H05K 7/20736; H05K 7/1488
See application file for complete search history.

(56) References Cited

U.S. PATENT DOCUMENTS

| | | | | |
|---|---|---|---|---|
| 3,602,774 A | * | 8/1971 | Grant | H05K 13/0069 361/695 |
| 5,150,277 A | * | 9/1992 | Bainbridge | H05K 7/206 361/695 |
| 5,361,188 A | * | 11/1994 | Kondou | H01L 23/467 165/104.34 |
| 5,506,750 A | * | 4/1996 | Carteau | G11B 33/128 361/679.32 |
| 5,796,580 A | * | 8/1998 | Komatsu | H05K 7/20727 361/679.47 |
| 6,234,591 B1 | * | 5/2001 | Driscoll | G06F 1/184 312/223.1 |
| 6,459,571 B1 | * | 10/2002 | Carteau | G06F 1/184 312/35 |

(Continued)

OTHER PUBLICATIONS

U.S. Appl. No. 14/217,154, filed Mar. 17, 2014, David Edward Bryan.

(Continued)

*Primary Examiner* — David M Sinclair
*Assistant Examiner* — Theron S Milliser
(74) *Attorney, Agent, or Firm* — Robert C. Kowert; Meyertons, Hood, Kivlin, Kowert & Goetzel, P.C.

(57) ABSTRACT

A system for storing data includes a discrete cooling module that can enable discrete cooling of mass storage devices installed in the chassis interior of a data storage module coupled to a rack. The discrete cooling module includes an air moving device and an air cover. The air moving device can induce and airflow through the chassis interior of the data storage module to remove heat from heat producing components of mass storage devices installed in the chassis interior. The air cover directs the airflow through the chassis interior. The discrete cooling module can isolate rotational vibrations generated by the air moving device from the mass storage devices installed in the chassis. Partial isolation can include indirectly coupling the discrete cooling module to the chassis via directly coupling with the rack.

20 Claims, 12 Drawing Sheets

(56) References Cited

U.S. PATENT DOCUMENTS

| | | | | |
|---|---|---|---|---|
| 6,506,111 | B2* | 1/2003 | Sharp | H05K 7/20754 165/122 |
| 6,765,796 | B2* | 7/2004 | Hoffman | H05K 7/20563 165/121 |
| 6,775,137 | B2* | 8/2004 | Chu | H05K 7/20754 165/120 |
| 6,801,428 | B2* | 10/2004 | Smith | G06F 1/181 165/80.3 |
| 6,955,062 | B2* | 10/2005 | Tilton | F28D 5/00 257/E23.1 |
| 7,085,133 | B2* | 8/2006 | Hall | H05K 7/20572 361/695 |
| 7,200,008 | B1 | 4/2007 | Bhugra | |
| 7,359,186 | B2 | 4/2008 | Honda et al. | |
| 7,508,663 | B2* | 3/2009 | Coglitore | H05K 7/20736 165/122 |
| 7,869,210 | B2* | 1/2011 | Moss | H05K 7/20836 361/694 |
| 8,028,793 | B2* | 10/2011 | Bard | A47B 97/00 181/198 |
| 8,154,870 | B1* | 4/2012 | Czamara | H05K 7/20736 361/694 |
| 8,191,841 | B2* | 6/2012 | Jeffery | G11B 33/02 165/104.13 |
| 8,331,095 | B2 | 12/2012 | Hu et al. | |
| 8,472,181 | B2* | 6/2013 | Doll | G06F 1/20 361/679.49 |
| 8,867,204 | B1* | 10/2014 | Gardner | H05K 7/1497 361/679.46 |
| 8,879,247 | B2* | 11/2014 | Archibald | G06F 1/20 165/104.33 |
| 2004/0057203 | A1* | 3/2004 | Rabinovitz | G06F 1/184 361/679.31 |
| 2004/0218355 | A1* | 11/2004 | Bash | H05K 7/20745 361/690 |
| 2005/0057898 | A1 | 3/2005 | El-Batal et al. | |
| 2005/0237716 | A1* | 10/2005 | Chu | H05K 7/20745 361/696 |
| 2006/0187634 | A1 | 8/2006 | Tanaka et al. | |
| 2007/0053169 | A1 | 3/2007 | Carlson et al. | |
| 2007/0091559 | A1 | 4/2007 | Malone | |
| 2007/0233781 | A1* | 10/2007 | Starr | G11B 33/126 709/203 |
| 2009/0144568 | A1 | 6/2009 | Fung | |
| 2010/0134972 | A1* | 6/2010 | Moss | H05K 7/20736 361/679.49 |
| 2011/0255237 | A1* | 10/2011 | Doll | G06F 1/20 361/679.46 |
| 2012/0243170 | A1* | 9/2012 | Frink | G06F 1/187 361/679.34 |
| 2014/0078668 | A1* | 3/2014 | Goulden | H05K 7/20736 361/679.47 |

OTHER PUBLICATIONS

U.S. Appl. No. 14/217,149, filed Mar. 17, 2014, David Edward Bryan.
U.S. Appl. No. 14/217,121, filed Mar. 17, 2014, David Edward Bryan.

* cited by examiner

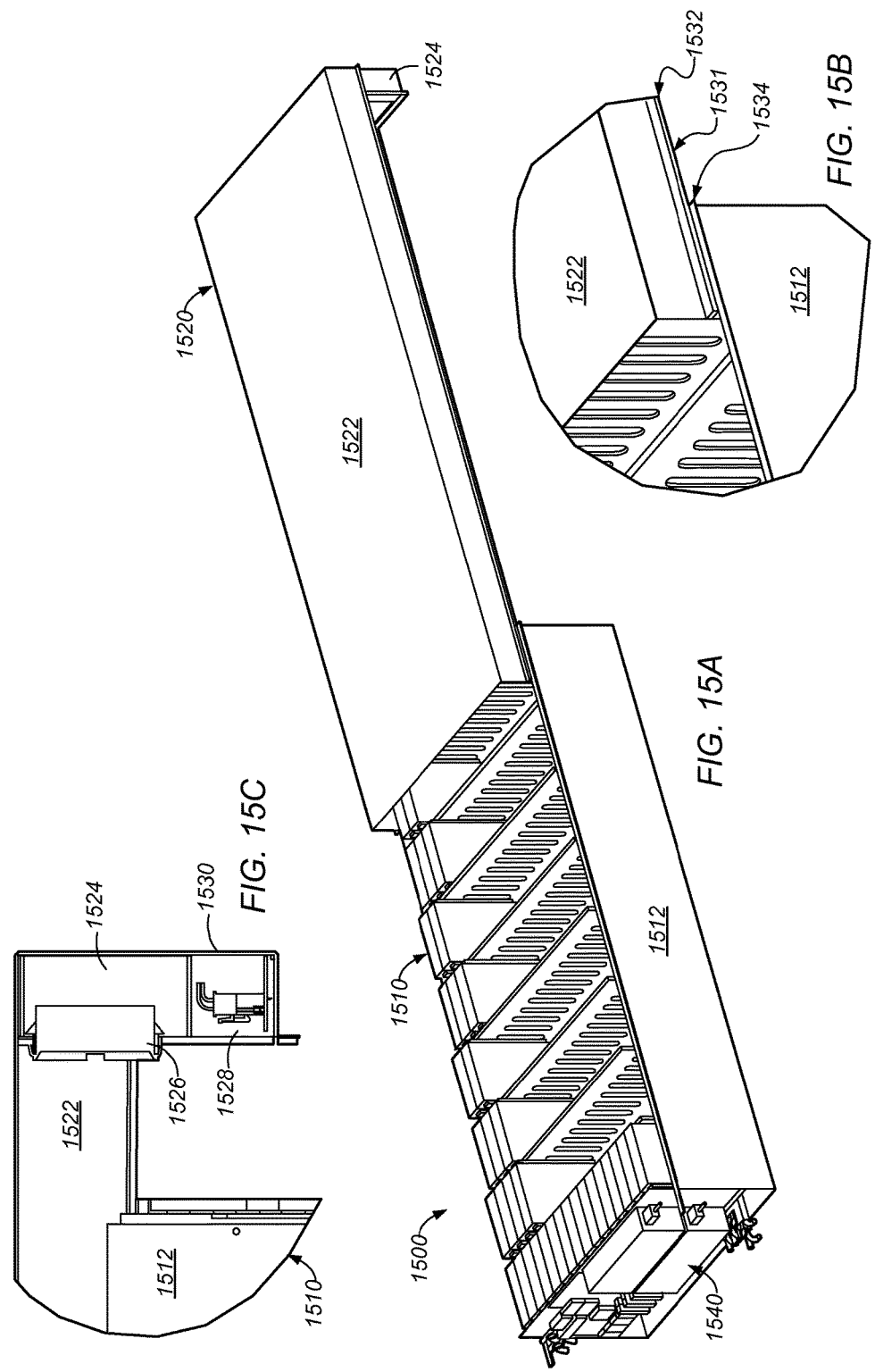

DISCRETE COOLING MODULE

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Computer systems typically include a number of components that generate waste heat. Such components include printed circuit boards, mass storage devices, power supplies, and processors. For example, some computers with multiple processors may generate 250 watts of waste heat. Some known computer systems include a plurality of such larger, multiple-processor computers that are configured into rack-mounted components, and then are subsequently positioned within a rack system. Some known rack systems include 40 such rack-mounted components and such rack systems will therefore generate as much as 10 kilowatts of waste heat. Moreover, some known data centers include a plurality of such rack systems.

Some servers include a number of hard disk drives (for example, eight or more hard disk drives) to provide adequate data storage. Typically, the hard disk drives for servers are of a standard, off-the-shelf type. Standard, off-the-shelf hard disk drives are often a cost effective solution for storage needs because such hard disk drives can be obtained at relatively low cost. Nonetheless, in server designs using such standard hard disk drives, the arrangement of the hard disk drives may leave a substantial amount of wasted space in the server chassis. This wasted space, especially when multiplied over many servers in a rack, may result in inadequate computing or storage capacity for a system.

Hard disk drives include motors and electronic components that generate heat. Some or all of this heat must be removed from the hard disk drives to maintain continuous operation of a server. The amount of heat generated by the hard disk drives within a data room may be substantial, especially if all of the hard disk drives are fully powered up at all times. Heat may be removed from the hard disk drives via an airflow flowing through a server.

In some cases, cooling systems, including air moving systems, may be used to induce an airflow through one or more portions of a data center, including an airflow through a rack that includes various heat producing components. However, some configurations of various equipment in a rack, including various servers and associated equipment, may result in some of the induced airflow through a rack bypassing one or more of the heat producing components in the rack. In some cases, airflows bypassing one or more various heat producing components may result in suboptimal utilization of at least some of the induced airflow to remove heat from heat producing components in the rack, and may represent suboptimal airflow through one or more rack computing systems, including one or more servers. Suboptimal airflow through a server may hinder heat removal from various heat producing components in the server, including hard disk drives, which may negatively affect server operations.

BRIEF DESCRIPTION OF THE DRAWINGS

FIG. 15A-C illustrates a data storage module including a discrete cooling module that can be coupled to a chassis of the data control module, according to some embodiments.

Figure 1:
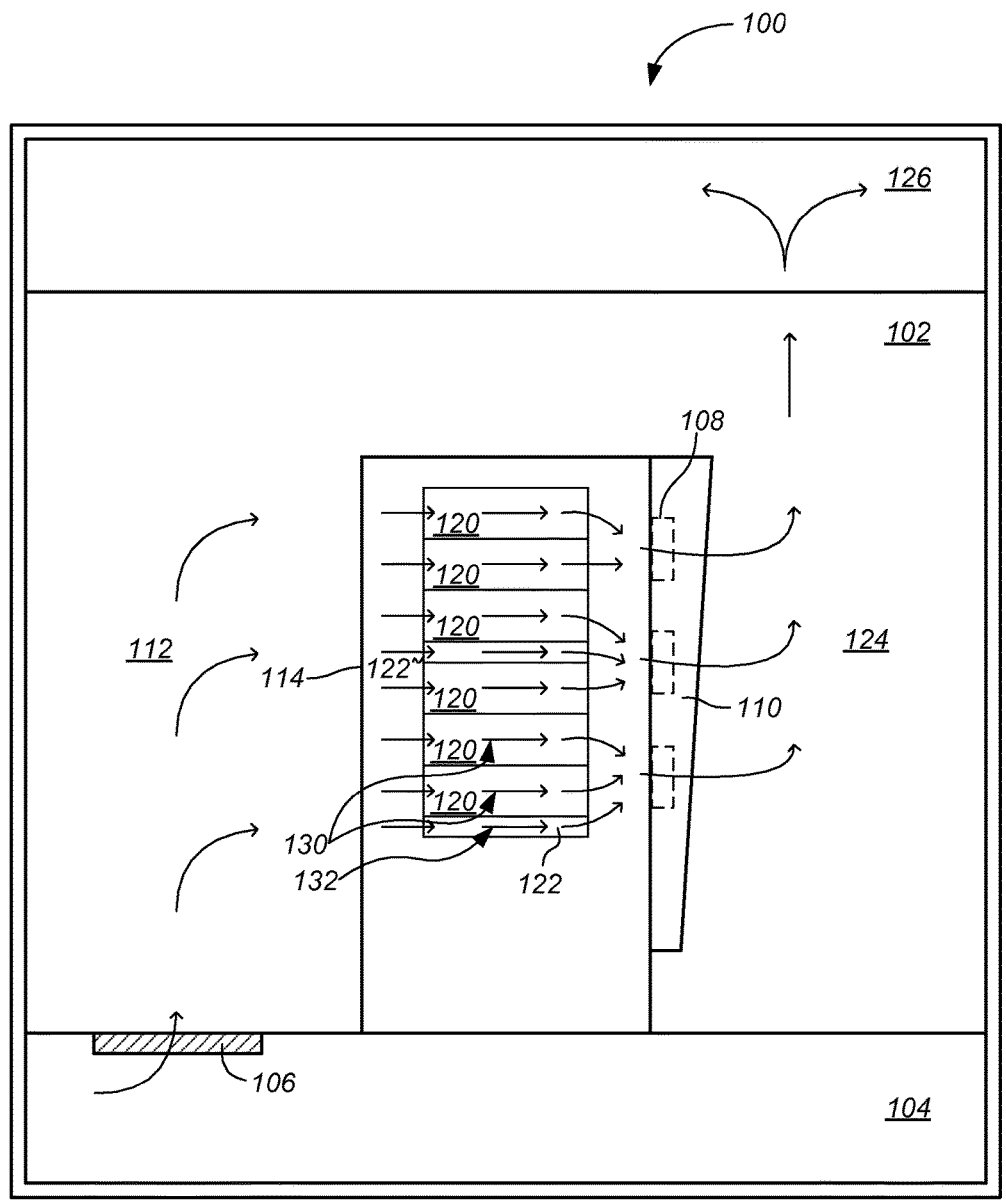
FIG. 1 is a schematic diagram illustrating a view of two data storage subsystems in a rack system and removal of heat from the data storage modules in the rack system according to some embodiments.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of computer systems, and systems and methods for performing computing operations, are disclosed. According to one embodiment, a system for storing data includes a rack and one or more data storage modules coupled to the rack. The data storage modules may include a chassis, two or more backplanes coupled to the chassis, one or more mass storage devices (for example, hard disk drives) coupled to the backplanes, an air plenum extending beneath one or more of the backplanes, and one or more data control modules mounted in the air plenum beneath one or more of the backplanes. The air plenum includes one or more air inlets and outlet and enables an airflow from an air inlet to an outlet to remove heat from at least one heat producing component of one or more of the mass storage devices. The data control modules may access the mass storage devices in the data storage modules.

According to one embodiment, a data storage module includes a chassis, two or more backplanes coupled to the chassis in a primarily horizontal orientation, one or more mass storage devices coupled to each of the backplanes, and one or more data control modules mounted in an inlet air plenum upstream of one or more of the backplanes. Each of the data control modules is configured to access one or more of the mass storage devices.

According to one embodiment, a method of providing data storage includes coupling mass storage devices with two or more backplanes coupled to a chassis, in a chassis interior at least partially encompassed by the chassis, and mounting one or more data control modules in one or more inlet air passages upstream of at least one of the backplanes in the chassis interior. The one or more data control modules are configured to access at least one of the mass storage devices.

According to one embodiment, a system for storing data includes a rack and one or more data storage modules coupled to the rack. The data storage modules may include a chassis, backplanes coupled to the chassis in a staggered configuration, one or more mass storage devices coupled to the backplanes, an inlet air plenum extending beneath at least one of the backplanes in the chassis interior from an inlet end of the chassis to an exhaust end of the chassis, and an exhaust air plenum extending above at least one of the backplanes. The chassis at least partially encompasses the chassis interior. The backplanes are coupled in a staggered configuration, such that a particular one of the backplanes proximate to the inlet end is elevated relative to another one of the backplanes proximate to the exhaust end. The inlet air plenum is progressively narrowed from the inlet end to the exhaust end and can enable an inlet airflow, of air that has been received into the chassis interior, from the inlet end to at least one of the backplanes to remove heat from at least one of the mass storage devices. The exhaust air plenum is progressively expanded from the inlet end to the exhaust end and can enable an exhaust airflow, of air that has removed heat from at least one of the mass storage devices, from the at least one of the mass storage devices to exit the chassis interior through the exhaust end.

According to one embodiment, a data storage module includes a chassis, backplanes coupled to the chassis in a staggered configuration in a chassis interior, mass storage devices coupled to each of the backplanes, and an inlet air plenum extending under at least one of the backplanes in the chassis interior from an inlet end of the chassis to an exhaust end of the chassis. The chassis at least partially encompasses the chassis interior. The backplanes are coupled in the staggered configuration, such that a particular backplane that is coupled to the chassis is elevated relative to an adjacent backplane. The inlet air plenum extending under at least one of the backplanes in the chassis interior from the inlet end to the exhaust end, wherein the inlet air plenum is progressively narrowed from the inlet end to the exhaust end and is configured to enable an inlet airflow, of air received into the chassis interior, from the inlet end to at least one of the backplanes to remove heat from at least one of the mass storage devices.

According to one embodiment, a method of providing data storage includes coupling mass storage devices on backplanes coupled to a chassis in a staggered configuration in a chassis interior of the chassis and providing an air passage that extends from a particular end of the chassis towards an opposite end beneath at least one of the backplanes. The backplanes are coupled in a staggered configuration, such that a particular backplane that is coupled proximate to a particular end of the chassis is elevated relative to another backplane that is coupled proximate to an opposite end of the chassis. The air passage is provided based at least in part upon the staggered configuration of the backplanes in the chassis interior.

According to one embodiment, a system for storing data includes a rack, one or more data storage modules coupled to the rack, and a discrete cooling module. A data storage module includes a chassis that at least partially bounds a chassis interior, two or more backplanes coupled to the chassis; and one or more mass storage devices coupled to at least one of the backplanes. The chassis comprises at least one set of chassis rail connectors. The discrete cooling module enables discrete cooling of the mass storage devices in the chassis of the data storage module. The discrete cooling module includes an air moving device and an air cover. The air moving device can induce an airflow through the chassis interior of the data storage module, such that the airflow removes heat from at least one heat producing component of the mass storage devices in the chassis interior. The air cover can direct an entirety of the airflow through the chassis interior to enable the discrete cooling. The discrete cooling module can at least partially isolate rotational vibrations generated by the at least one air moving device from the one or more mass storage devices in the chassis. To at least partially isolate the rotational vibrations from the one or more mass storage devices in the chassis, the discrete cooling module can indirectly couple with the particular data storage module via directly coupling with the rack.

According to one embodiment, an apparatus includes a discrete cooling module that provides discrete cooling of heat producing components of mass storage devices in an interior space of a data storage module. The discrete cooling module includes an air moving device and an air cover with which the air moving device is coupled. The air moving device induces an air flow through the interior space, from an inlet end of the interior space to an exhaust end of the interior space. The induced air flow removes heat from the heat producing components, and an entirety of the air flow passes between the interior space and an external environment via the at least one air moving device. The air cover couples with a chassis that partially encompasses, and supports the plurality of mass storage devices within, the interior space of the particular data storage module. The discrete cooling module couples with the data storage module based at least in part upon the coupling of the air cover with the chassis, such that at least the air cover encompasses at least a portion of the interior space that is unencompassed by the chassis and the at least one air moving device is positioned at one of the inlet end of the interior space or the exhaust end of the interior space.

According to one embodiment, a method includes configuring a discrete cooling module to provide discrete cooling to a particular data storage module coupled to a rack. The discrete cooling module includes an air cover coupled with an air moving device that can induce an airflow. Configuring the discrete cooling module to provide discrete cooling to the particular data storage module includes coupling the discrete cooling module to the particular data storage module, such that the air moving device is positioned to induce an airflow through the interior space of the particular data storage module to remove heat from one or more heat producing components of one or more mass storage devices in the particular data storage module.

As used herein, "air handling system" means a system that provides or moves air to, or removes air from, one or more systems or components.

As used herein, "air moving device" includes any device, element, system, or combination thereof that can move air. Examples of air moving devices include fans, blowers, and compressed air systems.

As used herein, an "aisle" means a space next to one or more elements, devices, or racks.

As used herein, "backplane" means a plate or board to which other electronic components, such as mass storage devices, circuit boards, can be mounted. In some embodiments, mass storage devices, which can include one or more hard disk drives, are plugged into a backplane in a generally perpendicular orientation relative to the face of the backplane. In some embodiments, a backplane includes and one or more power buses that can transmit power to components on the backplane, and one or more data buses that can transmit data to and from components installed on the backplane.

As used herein, "ambient" means, with respect to a system or facility, the air surrounding at least a portion of the system or facility. For example, with respect to a data center, ambient air may be air outside the data center, for example, at or near an intake hood of an air handling system for the data center.

As used herein, a "cable" includes any cable, conduit, or line that carries one or more conductors and that is flexible over at least a portion of its length. A cable may include a connector portion, such as a plug, at one or more of its ends.

As used herein, "circuit board" means any board or plate that has one or more electrical conductors transmitting power, data, or signals from components on or coupled to the circuit board to other components on the board or to external components.

In certain embodiments, a circuit board is an epoxy glass board with one or more conductive layers therein. A circuit board may, however, be made of any suitable combination of materials.

As used herein, "chassis" means a structure or element that supports another element or to which other elements can be mounted. A chassis may have any shape or construction, including a frame, a sheet, a plate, a box, a channel, or a combination thereof. In one embodiment, a chassis is made from one or more sheet metal parts. A chassis for a computer system may support circuit board assemblies, power supply units, data storage devices, fans, cables, and other components of the computer system.

As used herein, "computing" includes any operations that can be performed by a computer, such as computation, data storage, data retrieval, or communications.

As used herein, "computer system" includes any of various computer systems or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers dedicated to specific functions or serving multiple functions. Examples of computer operations include information processing, communications, testing, simulations, power distribution and control, and operational control.

As used herein, "data center module" means a module that includes, or is suitable for housing and/or physically supporting, one or more computer systems that can provide computing resources for a data center.

As used herein, to "direct" air includes directing or channeling air, such as to a region or point in space. In various embodiments, air movement for directing air may be induced by creating a high pressure region, a low pressure region, or a combination both. For example, air may be directed downwardly within a chassis by creating a low pressure region at the bottom of the chassis. In some embodiments, air is directed using vanes, panels, plates, baffles, pipes or other structural elements.

As used herein, "member" includes a single element or a combination of two or more elements (for example, a member can include two or more sheet metal parts fastened to one another.

As used herein, a "module" is a component or a combination of components physically coupled to one another. A module may include functional elements and systems, such as computer systems, circuit boards, racks, blowers, ducts, and power distribution units, as well as structural elements, such a base, frame, housing, or container.

As used herein, "mounting" a particular element on another element refers to positioning the particular element to be in physical contact with the other element, such that the other element provides one or more of structural support, positioning, structural load transfer, stabilization, shock absorption, some combination thereof, or the like with regard to the particular element. The mounted particular element may be positioned to rest upon one or more upper surfaces of the other element, independent of coupling the elements via one or more coupling elements. In some embodiments, mounting the particular element to another element includes coupling the elements such that the other element provides one or more of structural support, positioning, structural load transfer, stabilization, shock absorption, some combination thereof, or the like with regard to the particular element.

As used herein, "installing" a particular element on another element refers to physically coupling the elements such that the particular element is communicatively coupled with at least the other element. Installing the elements can include electrically coupling the elements via physically coupling an electrical connector of the particular element with a complementary electrical connector of the other element. Installing a particular element to another element can include electrically coupling a portion of the particular element to a portion of the other element and mounting another portion of the particular element to another portion of the other element.

As used herein, "primarily horizontal", also interchangeably referred to hereinafter as "horizontally-oriented", means at least more horizontal than vertical. In the context of an installed element or device, "primarily horizontal" or "horizontally-oriented" includes an element or device whose installed width is greater than its installed height. In some embodiments, a horizontally-oriented element or device is fully horizontal.

As used herein, "primarily vertical", also interchangeably referred to hereinafter as "vertically-oriented", means at least more vertical than horizontal. In the context of an installed element or device, "primarily vertical" or "vertically-oriented" includes an element or device whose installed height is greater than its installed width. In the context of a mass storage device, "primarily vertical" or "vertically-oriented" includes a mass storage device that is installed such that the installed height of the mass storage device is greater than the installed width of the mass storage device. In some embodiments, a vertically-oriented element or device is fully vertical.

As used herein, a "rack" means a rack, container, frame, or other element or combination of elements that can contain or physically support one or more computer systems.

As used herein, "room" means a room or a space of a building. As used herein, "computer room" means a room of a building in which computer systems, such as rack-mounted servers, are operated.

As used herein, a "space" means a space, area or volume.

As used herein, "shelf" means any element or combination of elements on which an object can be rested. A shelf may include, for example, a plate, a sheet, a tray, a disc, a block, a grid, or a box. A shelf may be rectangular, square, round, or another shape. In some embodiments, a shelf may be one or more rails.

As used herein, "shock absorbing", as applied to a supporting element for another element, means that the supporting element absorbs mechanical energy and/or at least partially mitigates shock and/or vibration loads. A shock-absorbing material may be elastic, viscoelastic, viscous, or combinations thereof.

In some embodiments, various components are mounted in a rack as separate modules, devices, etc. Such separate modules, devices, etc. may include heat-producing components that are cooled via separate airflows through a rack. Such separate modules can include one or more data storage modules, data control modules, etc. In some embodiments, each of the data storage modules and data control module in a rack include one or more heat producing components. For example, a data control module may include control circuit board assemblies, and a data storage module may include backplane circuit board assemblies and mass storage devices, each of which may include one or more heat producing components. In some embodiments, one or more air moving devices may induce an airflow through one or more of the modules in the rack to remove heat from the heat producing components.

In some embodiments, an airflow through an interior space of a data control module mounted in a rack may be separate from an airflow through an interior space of a data storage module mounted in a rack, such that the airflow through the interior space of the data control module does not remove a significant amount of heat from heat producing components in data storage module, and the airflow through the interior space of the data storage module does not remove a significant amount of heat from heat producing components in the data control module.

In some embodiments, an airflow through multiple modules coupled to a rack is induced by one or more common air moving devices of an air handling system. FIG. 1 is a schematic diagram illustrating a view of two data storage subsystems in a rack system 114 of a data center 100 and removal of heat from the data storage modules in the rack system according to some embodiments.

Air may flow into computing room 102 of data center 100 from sub-floor plenum 104 by way of vent 106. Rear fans 108 in fan door 110 may draw air from front aisle 112 into rack 114 on a front, or "inlet" side of the rack, and through data storage modules 120 and data control modules 122. Rear fans 108 may exhaust heated air, also referred to as "exhaust air", out of the rack into an exhaust aisle 124 on a rear, or "exhaust" side of the rack. The heated air may flow into ceiling plenum 126.

In one embodiment, each of data storage modules 120 is 4 U in height and each data control module 122 is 1 U in height, for a total of 13 U of height for each subsystem, and a total of 39 U used in the interior of the rack 114. Nevertheless, in various embodiments, data storage modules and data control modules may be any suitable height. In various embodiments, one or more subsystems of data control modules and data storage modules may include various ratios of devices. For example, in some embodiments, a data storage subsystem may include one data control module and one data storage module.

In some embodiments, one or more air moving devices induce airflow, 130, 132 through multiple subsystems in a rack 114. One or more air moving devices, which may include one or more rear fans 108, may induce the airflow via inducing a pressure difference, also referred to hereinafter as a pressure gradient, across an interior of the rack 114. Such a pressure gradient may result from one or more air moving devices reducing the air pressure in an interior space of one or more subsystems in the rack 114, reducing the air pressure on the exhaust side of the rack, 114 increasing the air pressure in an interior space of one or more subsystems, increasing the air pressure on the inlet side of the rack, etc. Air moving devices may include air moving devices of one or more types and configurations known to those having skill in the art, including air fans, air blowers, etc. As referred to herein, air blowers may be distinguished from air fans as air moving devices that exhaust an airflow with a changed direction and pressure relative to an airflow received into the blower, and air fans may be understood to include air moving devices that exhaust an airflow with a substantially similar direction relative to an airflow received into the fan.

In the illustrated embodiment, rear fans 108 in fan door 110 may draw air from front aisle 112 into rack 114 on a front, or "inlet" side of the rack, and through data storage modules 120 and data control modules 122, based on reducing air pressure on an exhaust side of the rack 114. The resulting pressure gradient across rack 114 may induce an airflow through the various modules 120, 122 from the inlet side of the rack, facing aisle 112, to the exhaust side of the rack.

In some embodiments, mounting data storage modules and data control modules in a rack as separate modules 120, 122, as illustrated in FIG. 1, results in separate airflows 130, 132 being induced through each separate module 120, 122. Such mounting of separate modules in a rack may result in suboptimal cooling of one or more heat producing components in one or more of the separate modules. For example, a given air moving device, including a rear fan 108, may be configured to induce a certain amount of airflow, represented as a mass flow rate, volumetric flow rate, etc. Where the air moving device induces airflow in each of multiple separate modules, the net airflow through the multiple separate modules may be a portion of the total airflow that the air moving device can induce. Each separate module may include separate respective air inlet and air exhaust vents, such that an airflow induced in a given module passes exclusively through that module. As a result, an airflow through a given module may be restricted to removing heat from heat producing components in that given module.

In some embodiments, an airflow through one or more modules may remove less heat than an equivalent airflow through another separate module. For example, data control module 122 may include heat producing components that produce relatively less heat than heat producing components in data storage modules 120. However, the separate airflows 130, 132 through the respective modules 120, 122 may be induced by a common air moving device, and an exhaust airflow 132 from module 122 may remove less heat per unit of mass, volume, etc. from the module than an exhaust airflow 130 from module 120, and thus may be cooler than the exhaust airflow 130 from module 120. As the exhaust airflow 132 from module 122 has excess cooling capacity, which may be considered as wasted cooling capacity of the air moving device 108. Furthermore, as the airflow through both modules 122, 120 may be induced by a common air moving device, an airflow through data control module 122 may be considered as an air bypass of data storage module 120, and the excess unused cooling capacity of the airflow through module 122 may be considered as wasted cooling capacity that could have been utilized to provide additional cooling to heat producing components in module 120.

Figure 2:
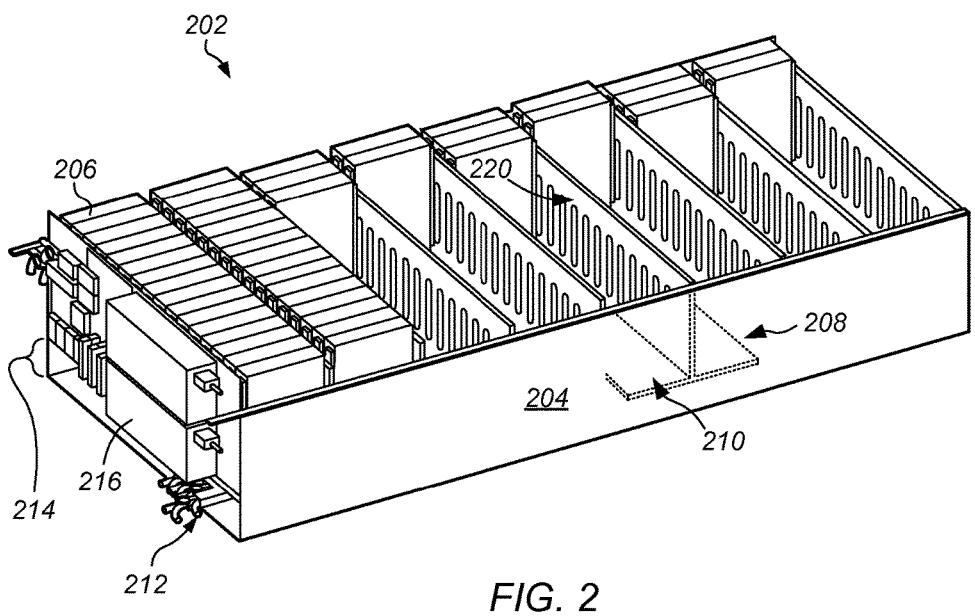
FIG. 2 illustrates a data storage module including a chassis having mass storage devices installed on multiple backplanes and a data control module installed in an air passage extending beneath one or more of the backplanes according to some embodiments.

In some embodiments, a data control module may be mounted within an interior space of a data storage module. In particular, one or more data control modules may be mounted in an interior space at least partially encompassed by a chassis of a data storage module ("chassis interior"). FIG. 2 illustrates a data storage module including a chassis having mass storage devices installed one or more of multiple backplanes and a data control module installed in an air passage extending beneath one or more of the backplanes, according to some embodiments. Data storage module 202 includes a chassis 204 that at least partially encompasses a chassis interior, mass storage devices 206 installed on one or more backplane assemblies, also referred to herein as "backplanes", 208 in the chassis interior, a data control module 212 installed in the chassis interior via a front vent 214 of the data storage module 202, and one or more power supply units 216.

In some embodiments, mass storage devices are installed on multiple backplanes that are coupled to the chassis of a data storage module. In the illustrated embodiment, for example, four backplanes 208 are coupled to chassis 204, and at least two mass storage devices 206 are installed on each backplane 208, and 32 mass storage devices are installed on one of the backplanes 208 that is proximate to the front vent 214. In some embodiments, a backplane 208 includes one or more horizontally-oriented backplane circuit boards 210 and one or more vertically-oriented guide plates 220 that can guide a mass storage device 206 to align with one or more particular connectors on the circuit board. The guide plate 220 may provide structural support and stabilization of one or more mass storage devices 206 installed on a backplane 208. In some embodiments, 32 mass storage devices 206 are installed on each of the four backplanes 208, so that a total of 128 mass storage devices 206 are installed in data storage module 202.

As shown in the illustrated embodiments, in some embodiments a backplane 208 can include two or more separate backplane circuit boards 210. The separate circuit boards 210 can be separated by one or more vertically-oriented guide plates 220, as shown, where each separate face of the guide plate 220 guides one or more mass storage devices 206 mounted on a separate one of the two or more circuit boards 210. In some embodiments, one or more of the backplanes 208 includes a single circuit board 210 on which a single row of mass storage devices 206 can be mounted. In some embodiments, a data storage device 202 includes backplanes 208 with variable numbers of circuit boards 210. For example, some backplanes 208 may include two circuit boards 210 on separate sides of a guide plate 220, and some backplanes 208 may include a single circuit board 210. In some embodiments, one or more of the backplanes 208 are arranged in a staggered configuration. In some embodiments, one or more of the backplanes 208 are arranged in a non-staggered configuration. In some embodiments, a backplane 208 includes one or more circuit boards 210 that are horizontally-oriented. In some embodiments, a backplane 208 includes one or more circuit boards 210 that are vertically-oriented.

In some embodiments, a data storage module includes one or more common power supply units at least partially in the chassis interior, where each of the common power supply units supplies electrical power to both mass storage devices and a data control module installed in the chassis interior. In the illustrated embodiment, power supply unit 216 may supply operating power to both the mass storage devices 206, via a backplane 208, and a data control module 212.

Figure 3:
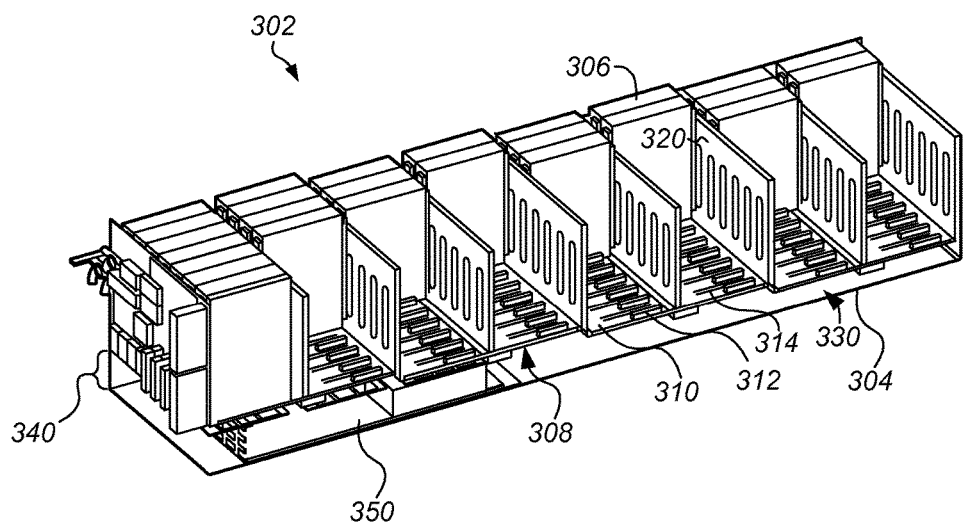
FIG. 3 illustrates a cross-sectional view of a data storage module including a chassis having mass storage devices installed on multiple backplanes and a data control module installed in an air passage extending beneath one or more of the backplanes according to some embodiments.

FIG. 3 illustrates a cross-sectional view of a data storage module including a chassis having mass storage devices installed on multiple backplanes and a data control module installed in an air passage extending beneath one or more of the backplanes according to some embodiments.

In some embodiments, a data storage module 302 includes one or more backplane assemblies 308 that are coupled to the data storage module chassis 304 in a primarily horizontal orientation, hereinafter referred to interchangeably as horizontally-oriented backplanes coupled to the chassis. A horizontally oriented backplane 308 may include one or more horizontally-oriented backplane circuit boards 310, one or more of which include connectors 312 that can electrically couple the circuit board 310 with one or more mass storage devices, including mass storage devices 306, via coupling of complementary electrical connectors (not shown) of the mass storage devices 306 with electrical connectors 312.

In some embodiments, each horizontally-oriented backplane 308 is comprised of one or more support components. For example, a backplane 308 may include a vertically-oriented support element 320, which can include one or more guide plates. The support element 320 may include one or more vents that enable a lateral airflow between opposite vertical faces of the support element 320. In some embodiments, one or more of the support elements 320 are substantially solid in construction and independent of manufactured air vents, so that air is precluded from flowing directly through the supports 320 between opposite vertical faces of the supports 320. As a result, where horizontally-oriented backplanes 308 are coupled to a chassis 304 in a chassis interior, the vertically-oriented supports 320 may at least partially establish vertically-oriented air passages at least partially bounded by one or more vertical faces of the supports, so that at least a portion of the supports 320 each direct at least a portion of airflow along a vertical face of the support 320. In addition, one or more of the horizontally-oriented backplane circuit boards 310 may include one or more air vents 314 that may direct a vertically-oriented airflow upwards from the circuit board 310 and across one or more mass storage devices 306 installed on the backplane 308 via coupling with at least a connector 312.

In some embodiments, one or more of the supports 320 includes one or more vents. The vents can enable at least some of a vertically-oriented airflow to be directed laterally between opposite faces of a given support 320. As a result, a backplane 308 can include one or more horizontally-oriented backplane circuit boards 310 that include one or more air vents 314 that may direct a vertically-oriented airflow upwards from the circuit board 310 and across one or more mass storage devices 306 installed on the backplane 308, and the backplane 308 can further include one or more vertical supports 320 that may direct at least a portion of the vertically-oriented airflow laterally, through one or more vents in the one or more vertical supports 320, in a laterally-oriented airflow that proceeds at least across one other set of mass storage devices 306. Such lateral flow through a support 320 can at least partially relieve air flow impedance through at least a portion of an interior of the chassis 304.

As shown in the illustrated embodiment, some embodiments of a data storage module 302 include one or more air passages 330 extending beneath one or more of the horizontally-oriented backplane circuit board assemblies 308 coupled to the chassis 304. The one or more air passages 330 may be established at least in part by an open space between a portion of the chassis 304 bounding a bottom end of the chassis interior and one or more lower ends of the backplane circuit board assemblies 308. Air entering the chassis interior from one or more air inlets 340 at an inlet end of the chassis may be directed along the one or more air passages 330 beneath the backplanes 308 and may be supplied, through one or more vents 314 in the backplanes 308, in one or more vertically-directed upwards air flows across one or more of the mass storage devices 306 and vertical faces of one or more backplanes 308, including one or more vertical faces of one or more supports 320. An entirety of the air flow into the chassis interior from the front vent 340 may be directed through at least a portion of the air passages 330 beneath one or more of the backplanes 308, and separate portions of the airflow may be supplied upwards from separate vents 314 across the various mass storage devices 306 installed on separate backplanes 308. In some embodiments, the various upwards-directed portions of the inlet airflow flow upwards from separate vents 314 substantially in parallel with each other, and each airflow portion removes heat from heat producing components of separate sets of devices. For example, airflow portions flowing upwards through vents 314 in a given backplane circuit board 310 of a given backplane 308 may remove heat exclusively from mass storage devices 306 installed on that given backplane 308, relative to mass storage devices 306 installed one another one of the backplanes. As a result, in some embodiments, each airflow portion flowing through vents of separate backplanes removes heat in parallel and independently of each other.

In some embodiments, air flow through an air passage 330 flows at least partially in heat transfer communication with one or more components of a data control module that is mounted in the air passage. In the illustrated embodiment, for example, data storage module 302 includes a data control module 350 that is mounted in at least one of the air passages 330 upstream of at least some of the backplanes 308. In some embodiments, where at least a portion of an air passage 330 in a data storage module 302 extends upstream of at least one of the backplanes 308, a data control module 350 can be mounted in the air passage 330 at least partially upstream of at least one of the backplanes 308 in the data storage module 302. Air flowing into air passages 330 via front vent 340 may pass in heat transfer communication with one or more heat producing components of data control module 350, thereby removing heat from the data control module. Air flowing in heat transfer communication with one or more components of the data control module 350 may be flowing upstream of one or more heat producing components of the mass storage devices 306 installed on one or more backplanes 308 in the data storage module 302. Air that flows through air passages 330 may be preheated by one or more heat producing components of data control module 350 prior to flowing through one or more vents 314 out of air passages 330 and subsequently removing heat from one or more heat producing components of one or more mass storage devices 306.

Figure 4:
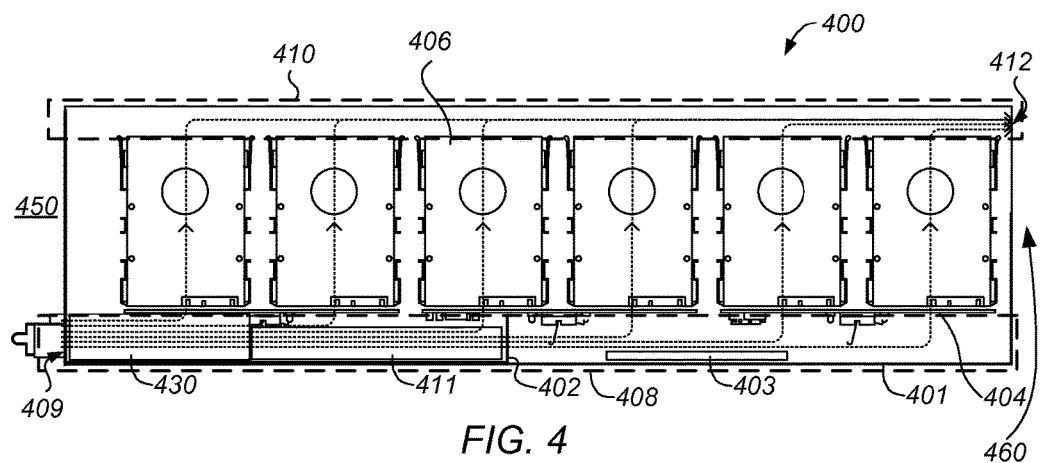
FIG. 4 illustrates a cross-sectional view of a data storage module including a chassis having mass storage devices installed on multiple backplanes coupled to the chassis at a common elevation and a data control module installed in an air passage extending beneath one or more of the backplanes according to some embodiments.

FIG. 4 illustrates a cross-sectional view of a data storage module 400 including a chassis 401 having mass storage devices 406 installed on multiple backplanes 404 coupled to the chassis 401 at a common elevation and a data control module 402 installed in an air passage 408 extending beneath one or more of the backplanes 404 according to some embodiments. Data storage module 400 includes a chassis 401 that at least partially encompasses an interior of the data storage module. The at least partially-encompassed interior is also referred to hereinafter as a "chassis interior".

Various components are coupled to the chassis 401 in the chassis interior, including one or more power supply units 430 and various horizontally-oriented backplanes 404 to which mass storage devices 406 are installed on each of the backplanes 404. In some embodiments, a data storage module 400 includes one or more vertically-oriented backplanes. In some embodiments, a data storage module 400 includes one or more vertically-oriented backplanes. In some embodiments, one or more power supply units 430 are mounted at least partially in inlet air plenum 402. In some embodiments, including as illustrated and discussed above with reference to at least FIG. 2, one or more power supply units are mounted to the chassis 401 externally to at least the inlet air plenum 402.

In the illustrated embodiment, three separate horizontally-oriented backplanes 404 are coupled to the chassis 401 in the chassis interior, and each backplane 404 is coupled with at least two mass storage devices 406. In some embodiments, at least some backplanes 404 include one or more connectors that can couple to one or more expander chips, buses that communicatively couple the backplanes to various components, including other backplanes, data control modules, power supply units, etc. Each backplane 404 is coupled to the chassis 401 in a particular position in the chassis interior, both relative to the inlet end 450 and exhaust end 460 of the chassis 401 and in elevation relative to bottom and top ends of the chassis interior.

In some embodiments, a backplane includes one or more horizontally-oriented backplane circuit boards. The horizontally-oriented backplane circuit board includes the connector that establishes an electrical connection with an installed mass storage device 406. As the backplane circuit board is horizontally-oriented, and a mass storage device 406 that is installed on the backplane 404 couples with at least an electrical connector on an upper surface of the backplane 404, the mass storage device 406 may be installed on the backplane 404 in a vertical orientation. For example, as shown in the illustrated embodiment, a mass storage device 406 installed on a horizontally-oriented backplane 404 may be oriented where the largest dimension of the mass storage device 406 is the length of the device extending substantially perpendicular to the plane of the face of the backplane 404 to which the mass storage device 406 is coupled.

In some embodiments, a data storage module 400 includes one or more air passages that extend through at least a portion of the chassis interior of the module. Such air passages can direct and supply air between various points in the chassis interior. For example, air passages can supply air from an ambient environment at an inlet end 450 to flow in heat transfer communication with one or more heat producing components and remove heat from same. In another example, air passages can remove air that has removed heat from one or more heat producing components, also referred to herein as exhaust air, from the chassis interior to an ambient environment at exhaust end 460, thereby removing the removed heat from the chassis interior. Heat removal from heat producing components in the chassis interior via one or more airflows allows operations utilizing such components without excessive heat buildup in the chassis interior, which can damage equipment.

In some embodiments, a data storage module 400 includes one or more air passages 408 that extend upstream of one or more backplanes 404 in the chassis interior. Such an air passage 408, also referred to herein as an "inlet air plenum", can extend beneath one or more backplanes 404 in the chassis interior and can be bounded on a lower side by at least a portion of the data storage module chassis 401 and bounded on at least portions of an upper side by lower portions of the one or more backplanes 404, where the lower portions of the one or more backplanes 404 at least partially direct airflow on the upper side of the inlet air plenum and the portion of the data storage module chassis 401 directs airflow on the lower side of the inlet air plenum. In some embodiments, the inlet air plenum 408 may extend from an air inlet 409 to extend at least in part above one or more of the backplanes 404, and a data control module 402 can be at least partially mounted in an inlet air plenum 408 extending above one or more backplanes 404, where an exhaust plenum 410 extends beneath one or more backplanes 404 and air is directed from the inlet air plenum 408 above the backplanes 404 to the exhaust plenum beneath the backplanes 404.

The inlet air plenum 408 may be in flow communication with an air inlet 409 on an inlet end 450 of the chassis 401 and may extend from the inlet end 450 towards the exhaust end 460 of the chassis 401. The inlet air plenum 408 can, in some embodiments, direct air that is received through the air inlet from an ambient environment through the inlet air plenum and beneath one or more of the backplanes 404. directing one or more airflows beneath backplanes 404 and from the air inlet 409 at the inlet end 450 towards the exhaust end 460 can enable air to be supplied from the inlet air plenum 408, at various points in the chassis interior along at least a portion of the length of the chassis from the inlet end 450 towards the exhaust end 460, into at least one other portion of the chassis interior.

For example, in the illustrated embodiment, data storage module 400 includes a chassis 401 with three horizontally-oriented backplanes 404, where an inlet air plenum 408 extends in a portion of the chassis interior beneath each of the three backplanes 404. The inlet air plenum 408 also extends beneath the mass storage devices 406 installed on the backplanes 404, and air being directed through the inlet air plenum 408 from the vent 409 at the inlet end 450 towards the exhaust end 460 is not in heat transfer communication with heat producing components in the mass storage devices 406, backplanes 404, etc. when still flowing through the plenum 408. As a result, an airflow through plenum 408 can be supplied to the various mass storage devices 406 without being preheated by other mass storage devices. Such non-preheated air supplied from the plenum 408 to each of the mass storage devices 406 may have a substantially common temperature, such that the capacity to remove heat from mass storage devices 406 installed on the backplane 404 that is coupled to the chassis at a position that is most proximate to the exhaust end 460 may be similar to the capacity to remove heat from mass storage devices 406 installed on the backplane 404 that is coupled to the chassis at a position that is most proximate to the inlet end 450. Such similar ("uniform") heat removal capacity for mass storage devices at various positions in the chassis interior can enable more optimal operation capacity for mass storage devices, regardless of which backplane in the chassis to which the device is coupled.

In some embodiments, where a data control module 402 is installed in the inlet air plenum 408 of a data storage module 400, air being directed through the plenum 408 may pass, in part or in full, in heat transfer communication with one or more heat producing components 403, 411 of the data control module 402, such that some or all of the portions of the air flow supplied from the plenum 408 to mass storage devices 406, while not pre-heated by other mass storage devices, may have initially removed heat from one or more heat producing components 403, 411 of the data control module 402 and subsequently removes heat from a separate one or more mass storage devices installed on a particular backplane. The airflow through the plenum 408 may have removed heat from one or more heat producing components of a power supply unit 430; in some embodiments where the power supply unit 430 is installed in the inlet air plenum 408.

As shown in the illustrated embodiment, in some embodiments, one or more air gaps at an upper end of an inlet air plenum 408 extending beneath one or more backplanes 404 enables a portion of the airflow through the inlet air plenum 408 to be supplied from the plenum to flow in heat transfer communication, and remove heat from, one or more heat producing components located in one or more separate air passages. For example, as shown, where the upper boundary of the inlet air plenum 408 is at least partially defined by components of the horizontally-oriented backplanes 404 in the chassis interior, gaps between adjacent backplanes 404 can provide portals through which a portion of the airflow through the inlet air plenum 408 can be supplied. In addition, the backplanes 404 may include one or more air vents, which may be located at locations on the backplanes 404 between coupling locations of adjacent mass storage devices 406 installed on the backplanes 404, such that air flowing through the vent passed between the adjacent mass storage devices 406. Such air vents may further be considered gaps in the upper portion of the inlet air plenum 408.

As shown in the illustrated embodiment, each gap in the upper portion of the inlet air plenum 408 may lead to a separate one of substantially parallel air passages through the chassis interior. In some embodiments, each air passage may flow in heat transfer communication with one or more sets of heat producing components of one or more mass storage devices 406. Each air passage may extend substantially in parallel with one or more other air passages being supplied with air from various air gaps to the inlet air plenum, so that air being supplied from the inlet air plenum 408 to the passages is supplied in separate parallel portions that flow substantially in parallel through the chassis interior and remove heat from one or more separate sets of heat producing components. In some embodiments, one or more lateral air passages between adjacent substantially parallel air passages may enable at least some mixing of substantially parallel air flows.

In some embodiments, air passages that supply air from an inlet air plenum across, in heat transfer communication with, etc. one or more heat producing components are supplied air through one or more various mechanisms. For example, a pressure gradient may exist across an air passage that includes the mass storage devices 406, such that air is supplied from the inlet air plenum 408 at a higher pressure than the pressure of air exiting the air passage. In another example, an air passage may extend vertically from the inlet air plenum 408, such that air rises from the inlet air plenum 408 through the passages due to the chimney effect, flow impedance, some combination thereof, etc. In the illustrated embodiment, for example, each separate air flow supplied by the inlet air plenum 408 is passes through one or more air gaps in an upper end of the plenum 408, and respective and separate portions of the airflow through the plenum 408 rise from the plenum, through the respective gaps, and through respective passages. In some embodiments, each passage is at least partially bounded and defined by one or more vertical faces of one or more backplane components, mass storage devices, etc. Each passage may serve as an air chimney, directing air upwards from plenum 408 and across one or more heat producing components of one or more mass storage devices 406.

For example, a horizontally-oriented backplane 404 may include one or more components, including vertically-oriented backplane support elements, that preclude lateral airflow through at least a portion of the chassis interior, so that air flowing through a passage from a plenum 408 and across mass storage devices 406 flows across the mass storage devices in a vertically-oriented upward-directed flow but does not flow laterally through the chassis interior at least at an elevation in the chassis interior that is common with at least a portion of the mass storage devices 406 installed therein.

In some embodiments, one or more air passages in a chassis interior include one or more air passages that extend above one or more horizontally-oriented backplanes, mass storage devices installed thereon, etc. Such air passages, referred to herein as exhaust air plenums 410, may be supplied with air from one or more air passages through the chassis interior from the inlet air plenum 408 and flowing across at least one mass storage device 406. As such air may have removed heat from one or more heat producing components of a mass storage device 406 installed on a backplane 404 and one or more heat producing components of a data control module 402 in plenum 408, such air may include exhaust air. In some embodiments, the exhaust air plenum 410 supplies air, including exhaust air, to the exhaust end 460 of the chassis. Where an air exit 412 is positioned at the exhaust end 460 of the chassis 401, the air supplied to the exhaust end of the chassis may exit the chassis, thereby removing any removed heat from the chassis interior.

In some embodiments, one or more data control modules 402 can be installed at least partially in the data storage module 400 by being mounted in at least a portion of the inlet air plenum 408, such that at least some components 403, 411 of the data control modules 402 are in heat transfer communication with at least some air being directed through the inlet air plenum 408. A data control module 402 mounted in an air plenum of a data storage module therefore can be cooled by at least a portion of the airflow through the data storage module interior that also cools one or more components of one or more mass storage devices 406, backplane circuit boards, etc.

As a result, airflow that initially cools one or more portions of the data control module 402 does not subsequently bypass components of the data storage module but rather subsequently cools one or more such components of the data storage module, thereby providing an optimal use of cooling airflow through a rack. For example, where a rack includes data storage, one or more of which include a data control module mounted therein, such that the entirety of manufactured air passages through the rack interior flow through data storage modules 400, an entirety of the induced airflow through the rack interior may flow through interiors of the data storage modules 400, thereby minimizing bypass of the airflow from components of data storage modules 400 and optimizing use of cooling capacity provided by an air handling system.

In some embodiments, one or more power supply units 430 included in a data storage module 400 may be coupled to backplanes 404 and data control module 402 components 403, 411. Such coupling can include a direct coupling between the power supply units 430 and one or more portions of the backplanes 404 and data control module 402, a coupling via one or more power busses, some combination thereof, or the like. In some embodiments, one or more power supply units 430 can supply power to backplanes 404, mass storage devices 406 installed on the backplanes 404, and the one or more components 403, 411 of one or more data control modules 402. Such power supply units 430 may be referred to as "shared power supply units", "common power supply units, etc.

In some embodiments, air flows from front to rear in a data storage module 400, such that air flowing through inlet air plenum 408 downstream from one or more portions of a data control module 402 flows under at least one of mass data storage backplanes 404. For example, as shown by the arrows in FIG. 4, air may flow through one or more front vents 409 of chassis 401 and across one or more portions of data control module 402. Air downstream from the one or more portions of data control module 402 may flow under one or more backplanes 404. In some embodiments, air exhausted from power supply units 430 mixes with air downstream from one or more portions of data control module 402 before flowing under one or more backplanes 404.

As referred to herein, an "entirety", including passage of an "entirety" of an airflow exclusively through interiors of data storage modules, refers to an entirety within manufacturing tolerances, such that a designed airflow rate is achieved despite insignificant losses due to such manufacturing tolerances, leakage, etc. For example, a cumulative airflow through a rack interior that collectively passes through chassis interiors of the multiple data storage modules therein, where air leakage, losses, etc. through various other pathways does not significantly affect the designed individual and collective airflow rates of the multiple data storage modules, may be understood to be an airflow that passes "entirely" and exclusively through the chassis interiors of the data storage modules.

Figure 5:
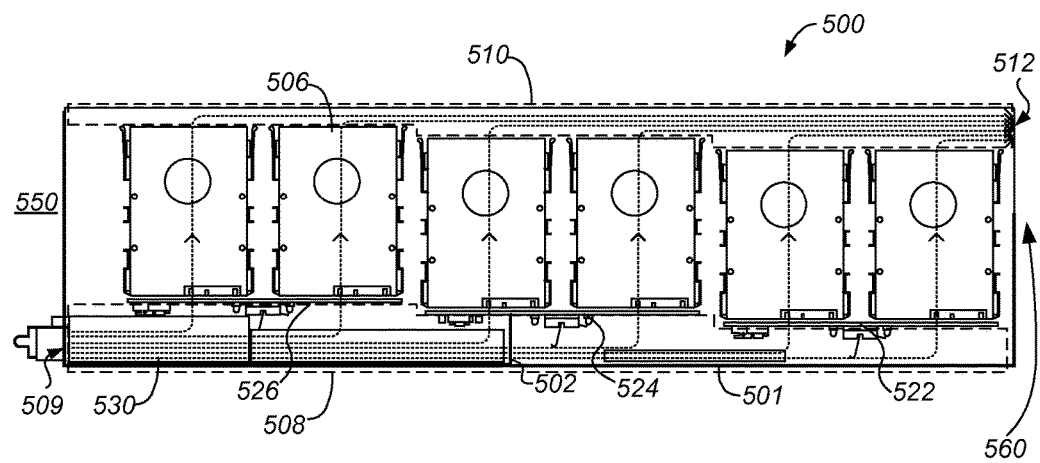
FIG. 5 illustrates a cross-sectional view of a data storage module including a chassis having mass storage devices installed on multiple backplanes coupled to the chassis in a staggered configuration and a data control module installed in an air passage extending beneath one or more of the backplanes according to some embodiments.

FIG. 5 illustrates a cross-sectional view of a data storage module including a chassis having mass storage devices installed on multiple backplanes coupled to the chassis in a staggered configuration and a data control module installed in an air passage extending beneath one or more of the backplanes according to some embodiments. In some embodiments, including the illustrated embodiment, one or more of the backplanes in the data storage module can include one or more horizontally-oriented backplanes that include at least one horizontally-oriented backplane circuit board to which one or more mass storage devices can be coupled. In some embodiments, one or more of the backplanes in the data storage module can include one or more vertically-oriented backplanes that include at least one vertically-oriented backplane circuit board to which one or more mass storage devices can be coupled.

In some embodiments, one or more of the backplanes coupled to the chassis in the chassis interior are coupled in a "staggered" configuration. As used hereinafter, a "staggered" configuration of backplanes refers to a configuration of backplanes through a chassis interior that have different elevations relative to one or more adjacent backplanes. Such differences in elevation may be partial differences in elevation, where the upper and lower ends of a given backplane may be different from corresponding upper and lower ends of one or more adjacent backplanes, but the lower end of a given backplane may be at a lower elevation relative to an upper end of an adjacent backplane. A staggered configuration of backplanes can include a sequence of backplanes along a length of the chassis from one end to an opposite end of the chassis, where each backplane extends substantially perpendicular to the length of the chassis, where each backplane in the sequence has a lower elevation in the chassis interior relative to an adjacent preceding backplane in the sequence and a higher elevation in the chassis interior relative to an adjacent following backplane in the sequence.

In some embodiments, one or more air passages extending through at least a portion of the chassis interior includes varying cross-sectional areas, perpendicular to the length of the one or more air passages along the length of the chassis from the inlet end towards the exhaust end. The varying cross-sectional areas may be established based at least in part upon varying elevations of one or more backplanes coupled in a staggered configuration. For example, in the illustrated embodiment, where backplanes 522, 524, 526 are coupled to chassis 501 in a staggered configuration from the inlet end 550 towards the exhaust end 560, where the inlet-proximate backplane 526 is elevated at least partially above adjacent following backplane 524, and similarly backplane 524 is elevated at least partially above adjacent following backplane 522, the inlet air plenum 508 extending from the inlet end 550 includes cross sectional areas, perpendicular to the direction of flow through plenum 508 from the inlet end towards the exhaust end, that decrease from the inlet end towards the exhaust end through the plenum. In some embodiments, the exhaust-proximate backplane 522 may be elevated at least partially above adjacent following backplane 524, and similarly backplane 524 may be elevated at least partially above adjacent backplane 526. In some embodiments, the inlet air plenum 508 may extend from an air inlet 509 to extend at least in part above one or more of the backplanes 526, and a data control module 502 can be at least partially mounted in an inlet air plenum 509 extending above one or more backplanes 526, where an exhaust plenum 510 extends beneath one or more backplanes 522 and air is directed from the inlet air plenum 508 above the backplanes 526 to the exhaust plenum beneath the backplanes 522.

The cross-sectional area of an air passage may change in a discontinuous manner along the length of the air passage. For example, the cross-sectional area of an air passage may progressively change in discrete steps along the length of the air passage. As shown in the illustrated embodiment, the cross-sectional area of plenum 508 progressively decreases along its length from inlet end 550 towards exhaust end 560 in discrete step changes. In addition, the cross-sectional area of plenum 510 progressively increases along its length from inlet end 550 towards exhaust end 560 in discrete step changes. Based at least in part upon the varying cross-sectional area along a length of an air passage, the air passage may be understood to "narrow" or "expand" corresponding to respective increases or decreases in its cross-sectional area. For example, plenum 508 progressively narrows along its length from the inlet end 550 towards the exhaust end 560, and plenum 510 progressively expands along its length from the inlet end 550 towards the exhaust end 560.

In some embodiments, the variation of cross sectional area at particular locations along a length of an air passage corresponds with a change in backplane elevation. The three illustrated backplanes 526, 524, 522 have progressively reduced elevations in the chassis interior from the inlet end 550 towards the exhaust end 560, and respectively installed mass storage devices 506 on the respective backplanes have correspondingly progressively reduced elevations in the chassis interior. As a result, the upper end of the plenum 508 is reduced along its length at each backplane and installed mass storage devices 506, such that the plenum progressively narrows in discrete step changes corresponding to a particular respective backplane and coupled components.

In some embodiments, a change in elevation between adjacent backplanes in a chassis interior can enable a portion of an airflow through an air passage extending beneath the backplanes to be diverted into another air passage extending from the air passage. Such other air passages may extend between the adjacent backplanes, through one or more vents in the backplanes, etc. Where a first backplane is at least partially elevated above a succeeding backplane, and an air plenum passes an airflow beneath the backplanes from under the first backplane to at least under the succeeding backplane, at least a lower portion of the succeeding backplane, being at a lower elevation than a corresponding lower portion of the first backplane, may extend at least partially beneath the first backplane, such that at least a portion of the airflow through the plenum impinges on the lower portion of the succeeding backplane, one or more components coupled thereto, etc. That portion of the airflow may be diverted by at least the lower portion of the succeeding backplane, one or more components coupled thereto, etc., upwards through an air passage between the first and succeeding backplanes, through one or more vents in the first backplane, etc.

In some embodiments, a staggered configuration of backplanes establishes one or more air passages, extending beneath at least one of the staggered backplanes, that enable one or more components, including one or more data control modules, to be mounted in at least a portion of the air passages to install the one or more components in the data storage module. As a result of a staggered configuration of backplanes, and as shown in the illustrated embodiment shown in FIG. 5, at least one backplane 526 of the staggered backplanes may be elevated above a position at which the backplane may be coupled to the chassis in a non-staggered configuration, as shown in FIG. 5. Such a relatively raised elevation of a backplane may increase the volume of the inlet air plenum 508 along at least a portion of the length of the chassis 501. As a result, because the volume of the inlet air plenum 508 that extends beneath at least backplane 526 is greater relative to the corresponding volume of the inlet air plenum 508 extending beneath the corresponding backplane 404 in FIG. 4, The inlet air plenum 508 can accommodate additional volume to components mounted in the inlet air plenum, including components of a data control module 502, one or more power supply units 530, etc., with a mitigated loss in air space in the relevant portion of the plenum 508 beneath at least backplane 526. Alternatively, as shown in FIG. 4-5, an increased volume in the portion of plenum 508 that extends beneath backplane 526, relative to the corresponding portion of plenum 408 in FIG. 4 may enable an additional amount of air space in the relevant portion of the plenum when equivalent components as shown in FIG. 4, including a data control module 502, power supply unit 530, etc., are mounted in the above portion of the plenum 508, thereby enabling a greater flow rate through the portion of the plenum 508 extending beneath at least backplane 526 where the backplane is in a staggered configuration, relative to the flow rate through the equivalent portion of the plenum 408 in FIG. 4 where the backplanes 404 are coupled at a common elevation. Such an increased flow rate through at least this portion of the plenum 508 relative to a plenum 408 extending beneath backplanes coupled at a common elevation, particularly where the components mounted in this portion may include heat producing components, may augment the amount of air that is directed to mass storage devices 506 installed on backplanes 524, 522 that are distal to the air inlet 509, thereby augmenting heat removal from such mass storage devices 506.

In some embodiments, where one or more air passages progressively narrow from an inlet end to an exhaust end of the chassis, the air passages progressively impede an airflow through the air passages from the inlet end towards the exhaust end. Airflow may be progressively impeded corresponding to changes in cross-sectional area of the air passages. For example, where air plenum 508 progressively narrows from inlet end 550 towards exhaust end 560, the airflow through plenum 508 may become progressively more impeded, also referred to as being progressively impeded, as the cross sectional area of the plenum 508 decreases along its length. Progressive impedance of flow through the plenum 508 at each change in cross sectional area can divert at least a portion of the airflow in the plenum 508 to be supplied out of the plenum 508 into at least one air passage extending above the plenum 508 and across at least one mass storage device 506 installed on a particular one of backplanes 526, 524, 522. The increased impedance may create a pressure gradient that diverts air through passages with reduced relative impedance relative to the plenum 508 at the point of increased impedance.

In some embodiments, progressively increased impedance of airflow through the inlet air plenum 508 can enable airflow rates out of the plenum 508 through each of the air passages extending across one or more mass storage devices 506, as illustrated in FIG. 5, to maintain one or more flow properties without one or more predetermined tolerance ranges. For example, progressively impeding flow through the plenum 508 can enable airflow out of the plenum 508 and across a mass storage device 506 installed on backplane 522 to have an airflow velocity, air mass flow rate, air volumetric flow rate, etc. that is similar to a corresponding flow characteristic of airflow out of the plenum 508 at a relatively less impeded location in the plenum 508 and across a mass storage device 506 installed on backplane 526.

In some embodiments, where the progressive narrowing of plenum 508 is established based at least in part upon the staggered configuration of the backplanes 526, 524, 522, the backplanes may be coupled to the chassis 501 in a staggered configuration that establishes an inlet air plenum 508 that progressively narrows such that airflow through the plenum is progressively impeded along its length in the direction of flow and maintains one or more airflow characteristics that exceed one or more predetermined threshold values of the flow characteristics.

In some embodiments, the backplanes 526, 524, 522 are coupled to the chassis 501 in a staggered configuration to establish air inlet and exhaust plenums that enable an inlet airflow received into the chassis interior from an ambient environment to be directed through a progressively-narrowed inlet air plenum beneath one or more backplanes, where separate portions of the airflow are supplied to separately remove heat from separate heat producing components coupled to separate backplanes. The airflow through the inlet air plenum may comprise a laterally-directed airflow. The separate portions of the airflow may be supplied in parallel through several separate parallel air passages across one or more mass storage devices 506, such that the separate portions of the airflow each comprises one or more upwards-directed vertical airflows. The separate portions of the airflow, in some embodiments, enter one or more exhaust air plenums subsequent to removing heat from one or more heat producing components, and the exhaust plenum may direct the airflow, which may include exhaust air, to the exhaust end of the chassis to exit the chassis interior. The airflow through the exhaust plenum to an exit 512 may comprise a laterally-directed airflow.

In the illustrated embodiments shown in FIG. 4-5, flow arrows illustrate a lateral flow of air through plenums 408, 508 and 410, 510, and upwards-directed flows of separate portions of the airflow through plenum 408, 508 through passages extending from the plenum 408, 508. Plenum 408, 508 supplies separate portions of air received from an ambient environment at the inlet end 450, 550 of the chassis 401, 501 through front vent 409, 509 across at least one mass storage device 406, 506 installed on a particular backplane, and plenum 410, 510 supplies the separate portions of air to exit the chassis interior via exit 412, 512 at exhaust end 460, 560. In some embodiments, the air flow through the chassis interior of data storage module 400, 500 is induced by one or more air moving devices.

An air moving device may be coupled to the data storage module at one or more positions in the chassis interior relative to at least the inlet end 450, 550 and the exhaust end 460, 560. For example, an air moving device may be coupled to the chassis 401, 501 proximate to the exhaust end 460, 560 of the chassis 401, 501, and the air moving device may induce the illustrated flow through the chassis interiors, shown by the illustrated air flow lines, based at least in part upon operating to reduce air pressure within a portion of the chassis interior to create a pressure gradient from the ambient environment at the inlet end 450, 550 to the air moving device, thereby inducing a flow of air along the pressure gradient through the chassis interior.

Figure 6:
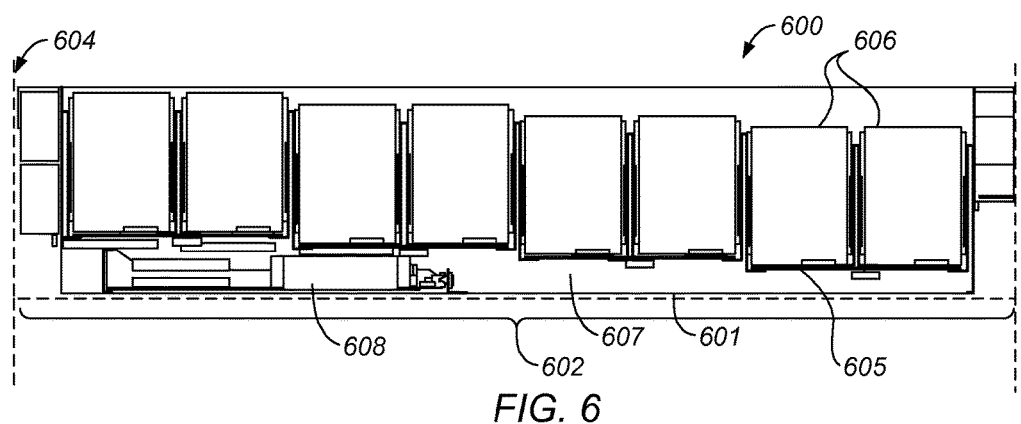
FIG. 6 illustrates a cross-sectional view of a data storage module including a chassis having mass storage devices installed on multiple backplanes coupled to the chassis in a full-depth staggered configuration and a data control module installed in an air passage extending beneath one or more of the backplanes according to some embodiments.

FIG. 6 illustrates a cross-sectional view of a data storage module including a chassis having mass storage devices installed on multiple backplanes coupled to the chassis in a full-depth staggered configuration and a data control module installed in an air passage extending beneath one or more of the backplanes according to some embodiments.

In some embodiments, a data storage module includes a full-depth configuration of mass storage devices. A data storage module that includes a full-depth configuration is configured to extend approximately along a full depth of a server rack, so that an interior space of the data storage module, which extends approximately along the full depth of the rack, includes mass storage devices. FIG. 6 illustrates one embodiment of a full-depth data storage module 600. The data storage module 600 includes a chassis 601 that extends approximately along the full depth 602 of the rack 604 in which the chassis 601 is mounted. As a result, additional storage devices may be mounted in the data storage module 600, relative to a chassis that does not extend approximately along the full depth 602 of the rack 604. For example, the illustrated data storage module 600 includes an additional backplane 605 to include a total of four backplanes, relative to the data storage modules illustrated in FIGS. 4-5 discussed above, which include three backplanes.

In some embodiments, a full-depth data storage module includes one or more sets of backplanes coupled to the full-depth chassis in a staggered configuration, a data control module mounted in an inlet air plenum that extends beneath one or more of the backplanes, etc.

As shown, a full-depth data storage module 600 may comprise additional mass storage modules 606 and maintain a common module height. For example, as shown in the illustrated embodiment, a full-depth data storage module 600 may have a height of 5 U. Where the backplanes in the full-depth data storage module 600 can accommodate a similar number of mass storage devices as backplanes in other data storage modules, such as backplanes 404, 522, 524, 526 illustrated in the data storage modules of FIG. 4-5, an additional backplane 605 in the illustrated full-depth module 600 represents an addition of 32 mass storage devices 606 in a data storage module 600 without increasing the height of the module, further representing up to a ⅓ increase in storage capacity at no additional height over other 5 U storage modules 400, 500 illustrated in FIG. 4-5.

In some embodiments, and as shown in the illustrated embodiment, a full-depth data storage module 600 may include one or more data control modules 608 mounted in the inlet air plenum 607 of the module 600. The data control modules 608, in some embodiments, can access mass storage devices 606 in the data storage modules 600 in which they are mounted and one or more other data storage modules. For example, as illustrated and discussed above, a data control module 608 mounted in an air plenum 607 of one data storage module 600 may access mass storage devices 606 on at least two other data storage modules, such that a data storage "subsystem" may comprise three data storage modules where one of the data storage modules includes one or more data control modules that can access mass storage devices of the three data storage modules.

In addition, in some embodiments where a data storage module includes a chassis 601 that extends approximately along the full depth 602 of the rack 604 in which the chassis 601 is mounted, various components that may be traditionally mounted at a common elevation with a data storage module in the rack are excluded from doing so. For example, a rack 604 may include a power distribution unit (PDU) door mounted on a front (inlet) end of the rack, where the PDU door includes one or more rack PDUs that distribute power to one or more servers in the rack via cable connections, bus connections, etc. In addition, a rack 604 may include a fan door on a rear (exhaust) end of the rack, where the fan door includes one or more air moving devices, including air fans, air blowers, etc., that move air through one or more modules mounted in the rack. In some embodiments, a full-depth data storage module 604 may preclude such components, including PDU doors, rack PDUs, fan doors, air moving devices, etc., from being coupled to the rack 604, at least at a common elevation with the full-depth data storage module 600, because the full-depth module 600 has sufficient chassis length 602 that the remaining space in the rack interior 604 at a common elevation with the full-depth module is insufficient to accommodate such other components via one or more of the front end of the rack, the rear end of the rack, etc. Such components that are excluded from accommodation in the rack 604 can include components that provide one or more capabilities that may be shared by multiple data storage modules in a rack. For example, where a rack 604 comprises a standard 19-inch rack, as will be understood with regard to EIA-310, revision D, a full-depth data storage module includes a chassis 601 that extends approximately along a full depth of the 19-inch rack 604, such that an insufficient amount of space within the opening of the rack 604, which can measure 17.72-inches in width, is available at a front end of the rack 604 to accommodate a PDU that is mounted in a PDU door that, when closed, projects the PDU through the front side of the rack 604 towards the front side of the chassis 601, a fan door that includes one or more air moving devices that project through a rear side of the rack 604 towards the rear side of the chassis, etc.

Figure 7:
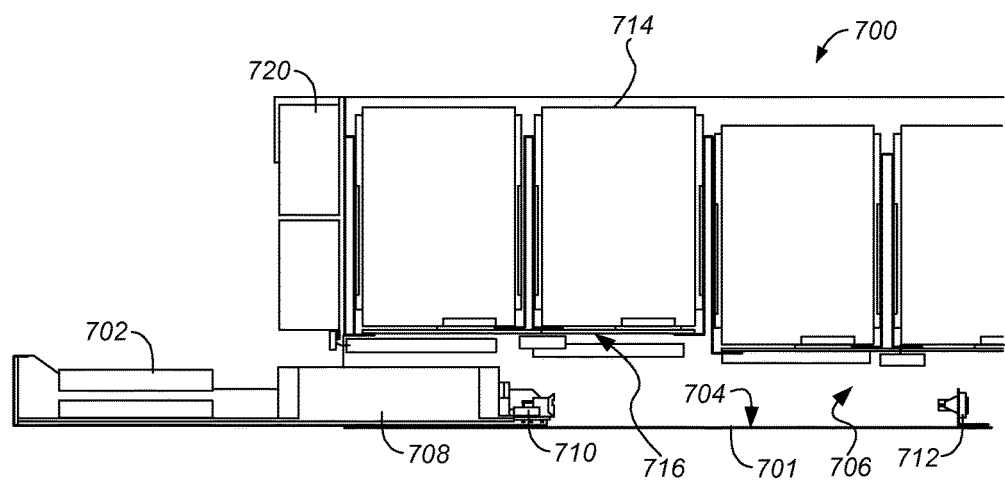
FIG. 7 illustrates a cross-sectional view of a data storage module including a chassis having mass storage devices installed on multiple backplanes coupled to the chassis and a data control module partially installed in an air passage extending beneath one or more of the backplanes according to some embodiments and including a blind mate connection.

FIG. 7 illustrates a cross-sectional view of a data storage module including a chassis having mass storage devices installed on multiple backplanes coupled to the chassis and a data control module partially installed in an air passage extending beneath one or more of the backplanes according to some embodiments and including a blind mate connection.

In some embodiments, installing a data control module in an inlet air plenum of a data storage module includes mounting the data control module on a surface bounding the inlet air plenum. As shown in the illustrated embodiment, for example, a data control module 702 can be installed in a data storage module 700 based upon being mounted on an upper surface 704 of the chassis 701 that bounds the inlet air plenum 706 into which the data control module is being mounted. Mounting a data control module in the inlet air plenum 706 may, in some embodiments, include slidably mounting the data control module into the inlet air plenum 706 on the upper surface 704. The data control module 702 may be removably mounted in the inlet air plenum 706, where the data control module can be removed from the inlet air plenum to uninstall the data control module from the data storage module, independently of other components in the data storage module, including mass storage devices 714 and backplanes 716.

In some embodiments, installing a data control module 702 includes coupling the data control module with a connector included in the data storage module to communicatively couple the data control module with one or more various components included in the data storage module 700, including one or more mass storage devices 714. Data storage module 700 may include one or more electrical connectors 712 which, when coupled with a corresponding one or more connectors 710 of the data control module 702, communicatively couple the data control module 702 to the various components of the data storage module 700. Coupling the connectors 710, 712 may include mounting the data control module 702 in the inlet air plenum 706, such that the complementary connectors 710, 712 are physically coupled.

In some embodiments, the connectors 710, 712 include one or more complementary pairs of blind mate connectors. Coupling the blind mate connectors may include mounting the data control module 702 in the inlet air plenum 706, which can include slidably mounting the data control module 702 into the plenum 706 via sliding the data control module over the surface 704 of chassis 701 into the inlet air plenum 706. Slidably mounting the data control module 702 into the inlet air plenum 706 can include sliding the data control module 702 in a direction approaching a blind mate connector 712 such that the blind mate connector 710 is slid into physically coupling with connector 712, thereby communicatively coupling module 702 with components of data storage module 700.

In some embodiments, connectors 710, 712 include one or more power connectors, where various components 708 of the data control module 702 can receive operating power from one or more power supply units 720 of the data storage module 700 via coupled complementary connectors 710, 712. The power supply unit 720 may include a "common" or "shared" power supply unit that supplies operating power to at least a component 708 of the data control module 702 and at least one mass storage device 714 installed on a backplane 716 of data storage module 700.

Figure 8:
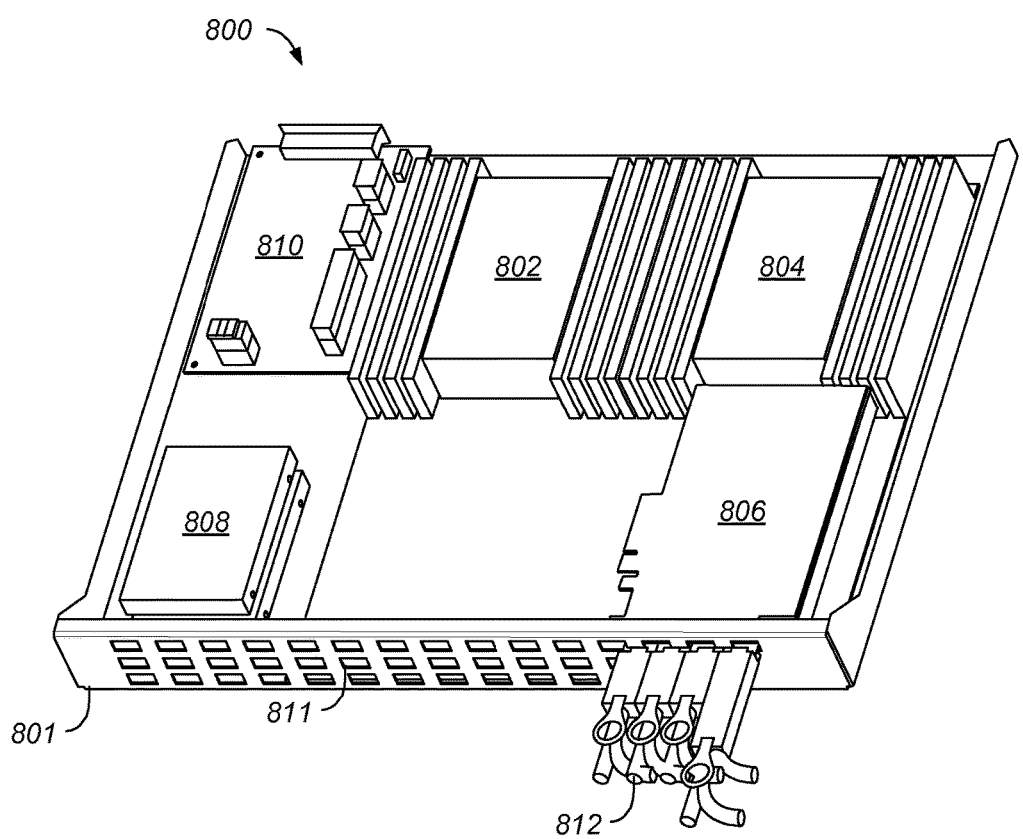
FIG. 8 illustrates a data control module included in a sled module that can be installed in a data storage module according to some embodiments.

FIG. 8 illustrates a data control module included in a sled module that can be installed in a data storage module according to some embodiments.

In some embodiments, a data control module that can be installed in an inlet air plenum of a data storage module is included in a sled module that can be installed in the inlet air plenum to install the data control module. FIG. 8 illustrates an embodiment of a sled module 800. The illustrated sled module includes at least one data control module 802, which includes at least one instance of a control circuit board. In some embodiments, the sled module 800 includes multiple data control modules 802, 804. The sled module may include various other components, including a communication unit 806 and connectors thereto 812, storage devices 808, connectors 810, etc.

In some embodiments, a sled module 800 includes a sled chassis 801 that supports the various components included in the sled module. As shown in the illustrated embodiment, sled chassis 801 supports the various data control modules 802, 804 included in the sled module 800. The sled chassis 801 may partially encompass an interior of the sled module 800, as illustrated. The illustrated sled chassis 801 encompasses a bottom and front portion of the sled interior, with multiple air inlet vents 811 collectively comprising an air inlet. In some embodiments, where the sled module 800 is installed in the inlet air plenum of a data storage module, the air inlet vents 811 collectively comprise the air inlet of the data storage module, where air received from an ambient environment through the vents 811 is supplied into the inlet air plenum of the data storage module via the interior of the sled module.

In some embodiments, the sled module includes one or more electrical connectors that can couple with electrical connectors in the data storage module to electrically couple one or more various components included in the sled module 800, including one or more data control modules, power supply units, etc., to various components of at least the data storage module, including one or more mass storage devices installed in the data storage module chassis interior. One or more of the connectors may include a blind mate connector that can couple with a complementary blind mate connector in the data storage module.

In some embodiments, the sled module can communicatively couple the one or more data control modules comprised in the sled module with at least one mass storage device in a data storage module via being removably mounted in the inlet air plenum of the data storage device, so that at least one blind mate electrical connector of the sled module couples with a complementary blind mate electrical connector of the chassis.

Figure 9:
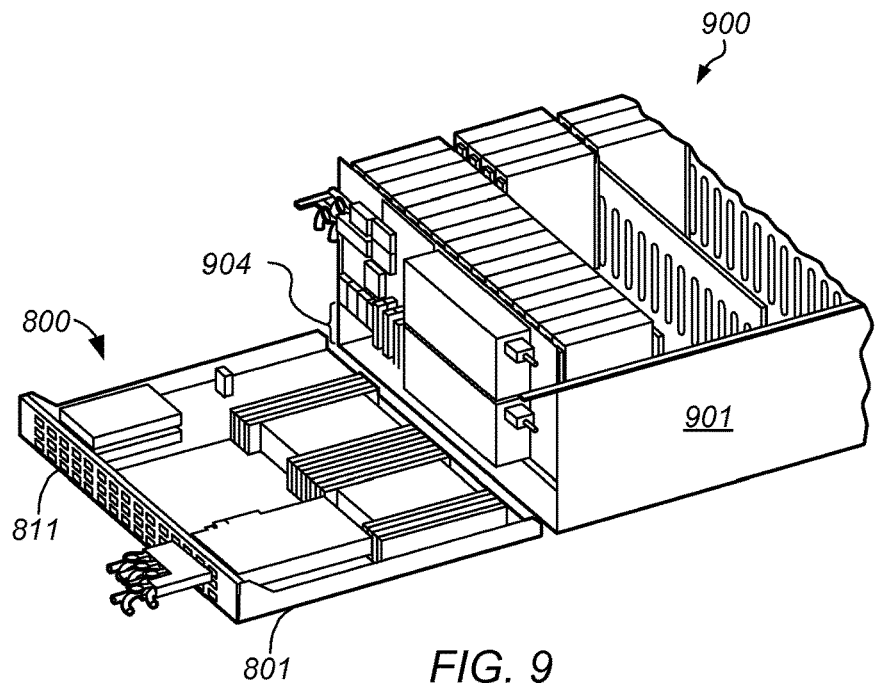
FIG. 9 illustrates a data storage module including a data control module comprised in a sled module removed from the chassis according to some embodiments.
Figure 10:
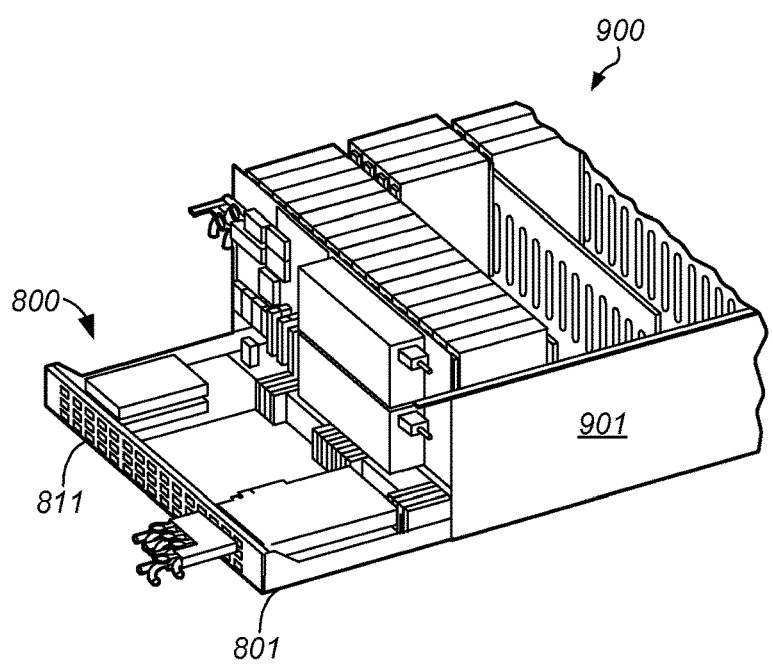
FIG. 10 illustrates a data storage module including a data control module comprised in a sled module adjustably positioned in the chassis according to some embodiments.

FIG. 9 illustrates a data storage module including a data control module comprised in a sled module removed from the chassis according to some embodiments. FIG. 10 illustrates a data storage module including a data control module comprised in a sled module adjustably positioned in the chassis according to some embodiments.

In some embodiments, the sled module can be removably installed at least partially in the inlet air plenum of the data storage module. The sled module 800 may be field-replaceable from the chassis interior independently of various components of the data storage module, including mass storage devices installed in the backplanes. The sled module 800 may be removably installed via interaction of corresponding complementary one or more sets of rail connectors on the sled module and the data storage module. For example, the data storage module chassis may include a set of chassis rail connectors extending through at least a portion of the inlet air plenum, and the sled module may include a set of sled rail connectors that are each complementary to a corresponding one of the set of chassis rail connectors. To be at least partially removably installed in the air plenum beneath at least one of the two or more backplanes, the sled module may be slidably coupled to the chassis via at least complementary coupling of the sled rail connectors and corresponding chassis rail connectors.

As shown in the illustrated embodiments of FIG. 9-10, a sled module 800, including a sled chassis 801, can be installed in a data storage module 900 via being slidably mounted in an interior of the chassis 901 of the data storage module 901. As shown, the sled chassis 801 can be slidably mounted in the chassis interior via an air inlet 904 of the chassis 901. The sled module 800, upon being installed in the data storage module 901, may substantially seal the air inlet 904, where the vents 811 of the sled module 800 collectively serve as the air inlet of the data storage module 900. In some embodiments, sled module 800 may be constructed to mount in the inlet air plenum such that an interface between the inlet 904 of the data storage module chassis 801 and the inlet end of the sled module 800 is sealed within manufacturing tolerances to mitigate air leakage across the interface.

In some embodiments, the sled module 800 is mounted in the chassis 901 interior via one or more various connectors. For example, the sled module 800 may be slidably mounted into the chassis interior via slidable coupling, also referred to as sliding coupling, of complementary corresponding rail connectors on the sled module 800 and chassis 901, so that the sled module 800 can be slid in and out of the chassis interior. In some embodiments, the sled module 800, chassis 901, etc. includes one or more wheels that enable the sled module 800 to be rolled in and out of the chassis interior. In some embodiments, the sled module 800 includes one or more coupling elements, including projections, which can be coupled with corresponding coupling elements, including holes, in the chassis 901 to mount the sled module 800 in a particular position in the chassis interior. The sled module 800 may be connected to the chassis 801 via interaction of one or more various attachment interfaces. Such attachment interfaces should be understood to encompass attachment systems known in the art.

Figure 11:
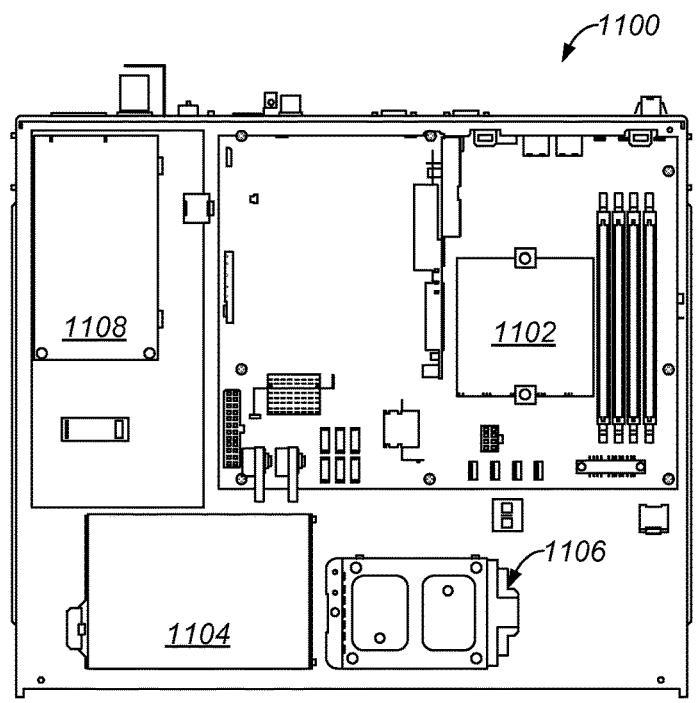
FIG. 11 illustrates a view of a sled module including multiple components according to some embodiments.
Figure 12:
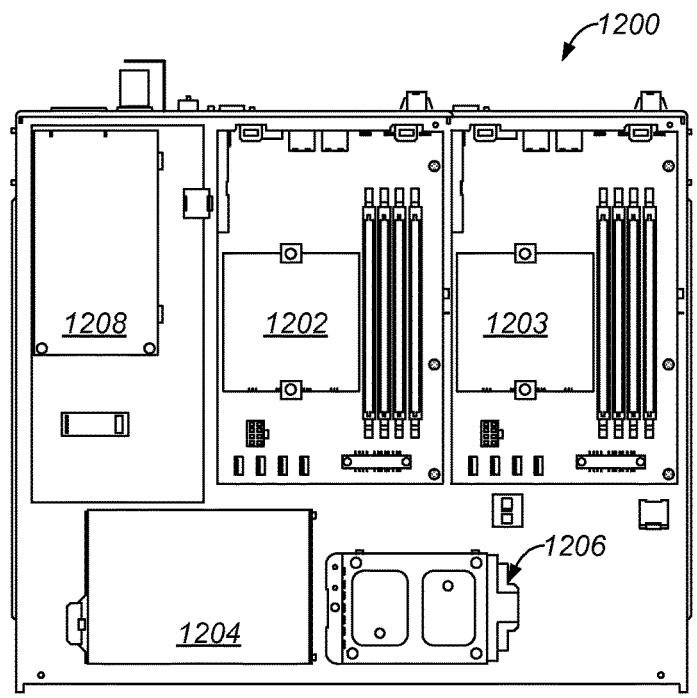
FIG. 12 illustrates a view of a sled module including multiple data control modules according to some embodiments.

FIG. 11 illustrates a view of a sled module 1100 including multiple components according to some embodiments. FIG. 12 illustrates a view of a sled module 1200 including multiple data control modules according to some embodiments.

In some embodiments, a sled module can accommodate one or more various components. Such components can include one or more data control circuit boards, one or more mass storage devices, power supply units, etc. For example, in the illustrated embodiment, sled module 1100 includes a single data control circuit board 1102, a power supply unit 1108, and multiple various mass storage devices 1104, 1106. In an example, the illustrated mass storage device 1104 can be a hard disk drive and mass storage device 1106 can be a solid-state drive. Various quantities of mass storage devices of various types may be included in a common sled module 1100. The mass storage devices may perform various functions, including providing storage for an operating system associated with circuit board 1102, providing additional storage capacity for a data storage module in which the sled module 1100 is installed, etc.

In some embodiments, the power supply unit 1108 comprises one or more power supply units that supply operating power to one or more various components included in a data storage module, including one or more components 1102, 1104, 1106 included in the sled module, one or more mass storage devices installed in the data storage module into which the sled module 1100 is installed, etc. Such a power supply unit may be referred to as a "common" or "shared" power supply unit.

As noted above, in some embodiments, one or more of the various components in the sled module 1100 can be interchangeably accommodated in the sled module 1100. For example, control circuit board 1102 may be swapped for one or more various circuit boards, mass storage devices, etc.

In some embodiments, an inlet air plenum in a data storage module may accommodate multiple sled modules installed therein, where each sled module includes one or more separate control circuit boards. A control circuit board may include one or more data control modules comprising at least one or more instances of processor circuitry configured to control access to one or more mass storage devices included in one or more data storage modules.

In some embodiments, a sled module may include multiple instances of control circuit boards. Each separate control circuit board may comprise a separate data control module. In the illustrated embodiment of FIG. 12, for example, sled module 1200 includes two separate data control modules 1202, 1203 each comprising separate instances of control circuit boards. Sled module can, in some embodiments, include one or more power supply units 1208, and multiple various mass storage devices 1204, 1206. Each data control module may access separate sets of mass storage devices installed in one or more various data storage modules, including one or more data storage modules external to the data storage module into which sled module is at least partially installed. In some embodiments, each data control module 1202, 1203 accesses mass storage devices installed in separate data storage modules. In some embodiments, a data control module 1203 provides data control redundancy for data control module 1202, where each of the data control modules 1202, 1203 can access at least some common mass storage devices, and data control module 1203 serves as a back-up data control module while data control module 1202 serves as a primary data control module for a given set of mass storage devices. As noted above, one or more of data control modules 1202, 1203 may be interchangeably accommodated in one or more portions of sled module 1203. Sled module may be field-swapped from a given data storage module and to another separate data storage module. In some embodiments, one or more sled modules installed in a given data storage module may be field-swapped, where the data control modules may be replaced, via replacing one or more sled modules in an air passage of a data storage module, without removing the data storage module from the rack into which it is mounted.

Figure 13:
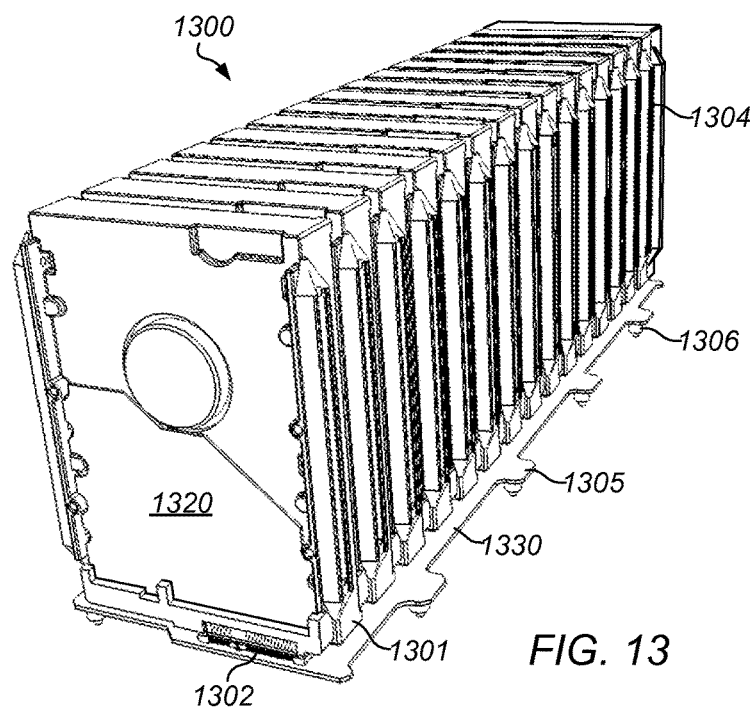
FIG. 13 is a top perspective view of a mass storage device assembly including a backplane, according to some embodiments.
Figure 14:
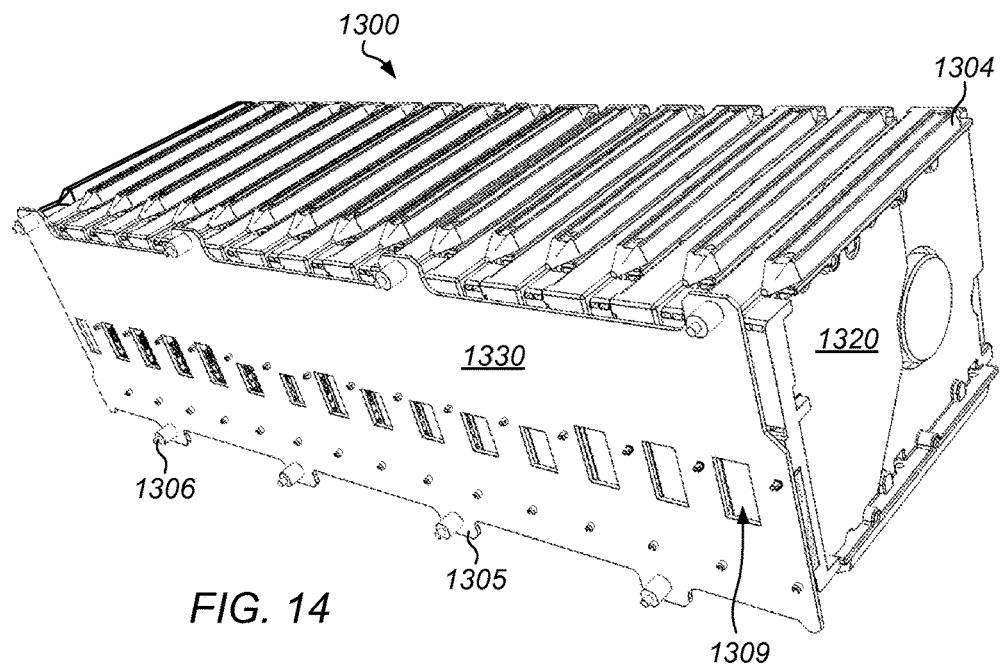
FIG. 14 is a bottom perspective view of a mass storage device assembly including a backplane, according to some embodiments.

FIG. 13 is a top perspective view of a mass storage device assembly including a backplane, according to some embodiments. FIG. 14 is a bottom perspective view of a mass storage device assembly including a backplane, according to some embodiments. Assembly 1300 includes mass storage devices 1320 and backplane circuit board assembly 1330. Mass storage devices 1320 may mount on backplane circuit board assembly 1330 at base 1301. Connectors 1302 may electrically couple mass storage devices 1320 to backplane circuit board assembly 1330.

Each of mass storage devices 1320 may be provided with a pair of opposing rails 1304. In some embodiments, rails 1304 may serve as a handle for mass storage devices 1320.

Backplane circuit board assembly 1330 may include vents 1309, tabs 1305, and mounting pads 1306. In some embodiments, mounting pads 1306 are made of a shock-absorbing material. In certain embodiments, mounting pads 1306 include threads (for example, for coupling a backplane to a chassis).

FIG. 15A-C illustrates a data storage module including a discrete cooling module that can be coupled to a chassis of the data storage module, according to some embodiments.

In some embodiments, a discrete cooling system is used to provide discrete cooling of data storage modules in a rack.

As used hereinafter, "discrete cooling" refers to cooling of an individual "discrete" module by a particular cooling system, where the particular cooling system provides cooling exclusively to the individual discrete module.

In some embodiments, the discrete cooling system 1500 includes a discrete cooling module 1520 that is configured to provide discrete cooling of heat producing components in a particular data storage module 1510 mounted in a rack. A discrete cooling module 1520 may include an array of one or more air moving devices 1524 and an air cover 1522. The one or more air moving devices 1524 may induce an airflow through an interior, including one or more portions of a chassis interior, of a data storage module 1510, where the induced airflow can remove heat from one or more heat producing components located in the interior. The air cover 1522 may be configured to couple with a chassis 1512 of the data storage module 1510. The cover 1522 may be configured to position the one or more air moving devices 1524 at one or more particular positions relative to the chassis 1512 when the cover 1522 is coupled to the chassis 1512, so that the one or more air moving devices 1524 can induce one or more particular airflows though the chassis interior. For example, where an air moving device 1524 is configured to "push" an airflow through a chassis interior by increasing the air pressure in the chassis interior, so that a pressure gradient between the chassis interior and an ambient environment on the exhaust end of the chassis 1512 is formed, the cover 1522 may be configured to position a housing 1530 that includes the air moving device 1524 at a front, or inlet, end of the chassis 1512 when the cover is coupled to the chassis. In another example, including the illustrated embodiment, where an air moving device 1524 is configured to "draw" an airflow through a chassis interior by decreasing the air pressure in the chassis interior, so that a pressure gradient between the chassis interior and an ambient environment on the inlet end of the chassis 1512 is formed, the cover 1522 may be configured to position a housing 1530 that includes the air moving device 1524 at a rear, or exhaust, end of the chassis 1512 when the cover 1522 is coupled to the chassis 1512.

The one or more air moving devices 1524 should be understood to include any air moving devices known in the art. For example, an air moving device 1524 may include an air blower device that can receive an airflow at a certain air pressure and flow direction and exhaust air at a different pressure and airflow direction relative to the received airflow. The pressure difference between an inlet port and exhaust port of the air blower device may be substantial, for example more than 20%. In another example, an air moving device may include an air fan device that can receive an airflow at a certain air pressure and flow direction and exhaust air at a different pressure and a substantially similar airflow direction relative to the received airflow. The pressure difference across the air fan device may be less significant than across an air blower with similar flow rate capacity.

In some embodiments, an air moving device may be included in a housing 1530 that can be positioned in a data storage module to receive air at an inlet at one pressure and flow direction and exhaust the air at another pressure and flow direction to induce an airflow through the interior of the data storage module. For example, as discussed above, an air moving device housing 1530 may be positioned at an exhaust end of an interior space of a data storage module, where the air moving device 1524 can reduce the air pressure in at least a portion of the interior space to induce airflow through the interior space.

In some embodiments, the air moving device 1524 includes an air blower device that is configured to be positioned at the exhaust end so that the air blower device reduces air pressure in at least the exhaust end of the interior space to induce airflow into the interior space at the inlet end, through the interior space to the exhaust end, and out of the interior space at the exhaust end through the one or more air blower devices. The one or more air blower devices may be configured to position the inlet of the blower device in a downwards-facing position and the outlet of the blower device facing outwards from the data storage module in a substantially perpendicular orientation relative to the exhaust end of the data storage module. For example, in the illustrated embodiment, the discrete cooling module 1520 includes one or more air blower devices 1524 that are integrated with the air cover via a housing 1530 and may have inlets facing downwards towards the mass storage devices coupled to the exhaust-proximate backplane and outlets facing outwards from the module. The blowers may receive exhaust airflows through the exhaust air plenum on the upper end of the interior space, at least partially encompassed and directed by the air cover, and can further receive exhaust airflows directly from the heat producing components positioned beneath the respective blowers.

In some embodiments, the cover 1522 is configured to at least partially encompass an interior space of a data storage module 1510 when coupled to the chassis 1512. The cover 1522 may be configured to encompass at least some portions of the interior space that are at least partially unencompassed by the chassis 1512. For example, where a data storage module 1510 includes a chassis 1512 that encompasses front, side, and bottom ends of an interior space of the data storage module, and encompasses a lower portion of a rear end of the interior space, the cover 1522 may be configured to encompass at least a portion of a top end and the rear end of the interior space that is unencompassed by the chassis. Where the cover 1522 is coupled to an air moving device housing 1530 that is configured to draw air through the interior space, the cover 1522 may be configured to position the air moving device housing 1530 at an upper portion of the rear end of the chassis 1512, such that the air moving device housing 1530 and the chassis 1512 cooperatively encompass the rear end of the chassis 1512. In another example, the chassis 1512 and one or more air moving device housings 1530 may cooperatively encompass one or more various ends of the interior space of the data storage module 1510.

In some embodiments, an air cover 1522 may direct air in the interior space along one or more particular pathways through the interior space. For example, where the cover 1522 is configured to position an air moving device 1524 at a rear end of the chassis interior, the cover 1522 may further be configured to at least partially encompass the top end of the chassis interior to direct one or more airflows in an upper portion of the chassis interior, including one or more exhaust airflows, towards the air moving device 1524 at the exhaust end. As a result, air bypass of the air moving device 1524 can be mitigated, and by directing an entirety of the airflow through the chassis interior through the one or more air moving devices 1524, the cover 1522 can enable a greater flow rate through the chassis interior by mitigating the available air exits from the chassis interior.

In another example, where the cover 1522 is configured to position an air moving device housing 1530 at a front end of the chassis interior, the cover 1522 may further be configured to at least partially encompass the top end of the chassis interior to direct one or more airflows in an upper portion of the chassis interior, including one or more exhaust airflows, towards the exhaust end.

In some embodiments, the discrete cooling module 1520 may receive power for one or more components from a power supply unit 1540 included in the data storage module 1510 to which the discrete cooling module 1520 provides discrete cooling. For example, a data storage module system 1500 may include one or more "shared" power supply units 1540 that are configured to supply power to various components in the data storage module 1510, including mass storage devices, control modules, etc. The discrete cooling module 1520 and data storage module 1510 may include complementary connectors 1526, including blind mate connectors that can couple to enable the power supply unit 1540 to supply operating power to one or more components of the discrete cooling module 1520, which may include components included in an air moving device housing 1530, including one or more air moving devices 1524, one or more air moving device control circuit boards 1528, etc. As a result, one or more components of the discrete cooling module, including one or more air moving devices, may "share" a common power supply unit with one or more components of the data storage module, including one or more mass storage devices, control modules, etc.

One or more of the discrete cooling module 1520, the data storage module 1510, some combination thereof, or the like may be adjustably positioned such that various portions of the discrete cooling module 1520 come into physical contact with portions of the data storage module 1510, including portions 1534 of the chassis 1512, thereby establishing one or more interfaces between the portions. In some embodiments, the discrete cooling module 1520 includes one or more gasket components 1531 on one or more edges 1532. The gasket components 1531 may include one or more various shock absorbing elements, sealing elements, etc. known in the art. The gasket components 1531 may seal an interface established between the air cover edge 1532 and one or more portions 1534 of the chassis 1512 when the discrete cooling module is coupled to the chassis, as shown in the illustrated embodiment. Sealing the interface may provide additional protection against air leakage from the module at locations other than the intended exhaust ports and may restrict airflow between one or more respective portions of the air cover and the chassis at the interface.

Figure 16A:
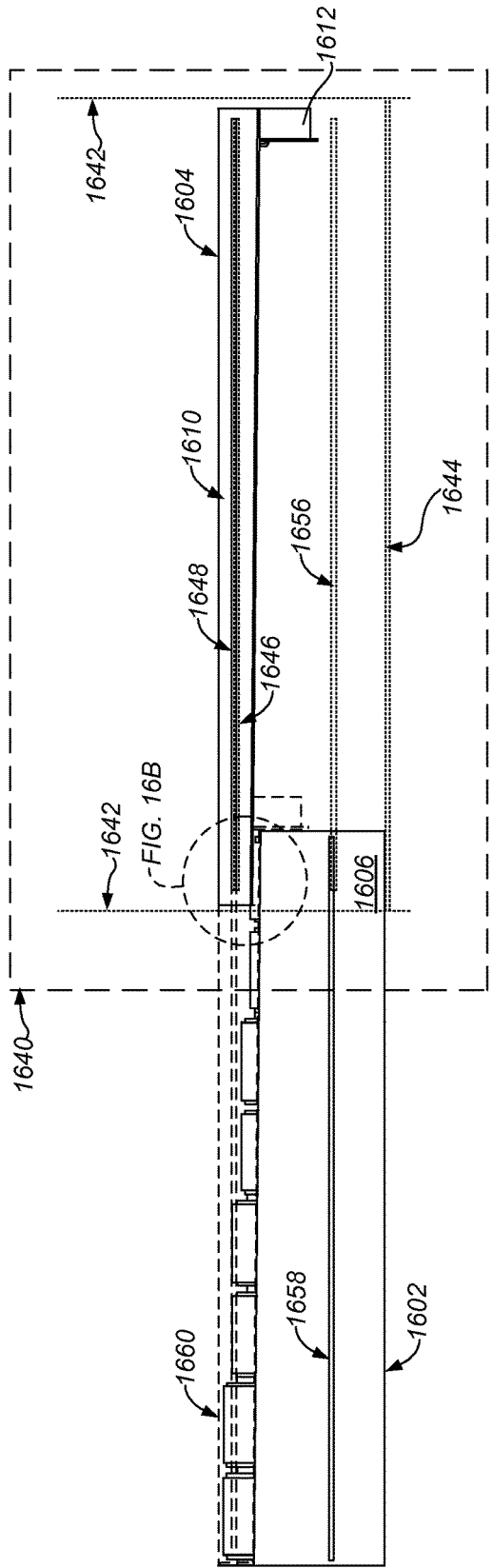
FIG. 16A-B illustrates a data storage module including a discrete cooling module that can be coupled to a chassis of the data control module, according to some embodiments.
Figure 16B:
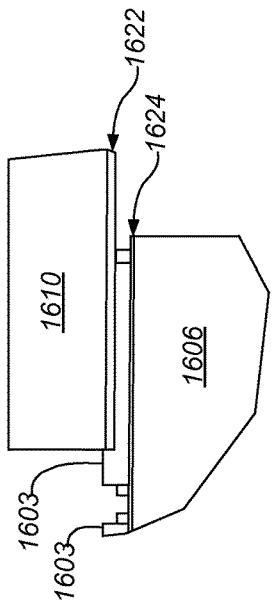

FIG. 16A-B illustrate a data storage module 1602 mounted in a rack 1640, including a data storage module chassis 1606, and a discrete cooling module 1604 that can be coupled to the chassis 1606, according to some embodiments.

In some embodiments, the chassis 1606 is directly coupled with a rack 1640 via coupling of one or more complementary connectors 1658, 1656 on each of the chassis 1606 and rack 1640, respectively. In some embodiments, the connectors 1656, 1658 include complementary support rails that enable the chassis 1606 to be at least partially slidably adjusted relative to the rack 1640. For example, the chassis 1606 may be slidably adjusted, via interaction between corresponding complementary support rail connectors 1656, 1658 on each of the chassis 1606 and the rack 1640, to slidably and adjustably position the chassis 1606 relative to the rack 1640. The chassis 1606 may be adjustably positioned such that various portions of the chassis 1606 come into physical contact with portions of the discrete cooling module 1604, which may be coupled to the rack 1640 via one or more complementary connectors 1646, 1648, thereby establishing one or more interfaces between the chassis 1606 and discrete cooling module 1604.

In some embodiments, the discrete cooling module 1604 is coupled "indirectly" to the chassis 1606 of the data storage module 1602. Such indirect coupling may include directly coupling of the discrete cooling module 1604 to one or more portions of a rack 1640 in which the chassis 1606 is mounted, such that the discrete cooling module 1604 is indirectly coupled to the chassis 1606 via directly coupling with the rack 1640. The discrete cooling module 1604 may be coupled to the rack 1640 via coupling of one or more complementary connectors 1648, 1646 on each of the discrete cooling module and the rack, respectively. In some embodiments, the connectors 1646, 1648 include complementary support rails that enable the one or both of the chassis 1606 and the discrete cooling module 1604 to be at least partially slidably adjusted relative to the rack 1640. For example, as shown in the illustrated embodiment, the chassis 1606 may be slidably adjusted, via interaction between corresponding complementary support rail connectors 1656, 1658 on each of the chassis 1606 and the rack 1640, to slidably and adjustably position the chassis 1606 relative to the rack 1640. In the illustrated embodiment, the discrete cooling module 1604 remains mounted in the rack 1640, so that slidably adjusting the chassis 1606 with respect to the rack 1640 includes slidably adjusting the chassis 1606, which can include slidably translating same, independently of the discrete cooling module 1604.

In some embodiments, the discrete cooling module 1604 and the chassis 1606 can be slidably adjusted in conjunction with respect to the rack 1640. For example, as illustrated by the dashed-line representation 1660 of the discrete cooling module 1604, both the discrete cooling module 1604 and the chassis 1606 can be slidably adjusted in conjunction, via interaction between corresponding complementary support rail connectors 1658 and 1648 with the respective rack rail connectors 1656 and 1646 on the rack 1640 to slidably adjust both the discrete cooling module 1604 and the chassis 1606 substantially in unison with respect to the rack 1640.

On or more of the discrete cooling module 1604, the chassis 1606, some combination thereof, or the like may be adjustably positioned such that various portions of the discrete cooling module 1604, including portions of an air cover 1610 and an air moving device housing 1612, come into physical contact with portions of the data storage module 1602, including portions of the chassis 1606, thereby establishing one or more interfaces between the respective portions. As the discrete module 1604 may be directly coupled to the rack 1640, rather than being directly coupled to the data storage module chassis 1606, the structural load of the discrete cooling module 1604 may be transferred substantially entirely to the rack 1604 via complementary connectors 1648, 1646 of the discrete cooling module 1604 and the rack 1640, such that the amount of structural load transferred from the discrete cooling module 1604 to the data storage module chassis 1606 via the one or more established interfaces is negligible. As a result, the discrete cooling module 1604 may be understood to be "indirectly" coupled to the chassis 1606, although an interface between the two is established based upon physical contact, as the structural load of the discrete cooling module 1604 is not significantly transferred to the chassis 1604.

In some embodiments, one or more of the connectors via which the discrete cooling module is directly coupled to a rack include one or more sets of support rails. In one example, the rack 1640 includes a set of support rails 1646 that includes a pair of rack support rails 1646 coupled to the rack 1640 proximate to one or more sides of a data storage module chassis 1606. Where the rack includes post elements 1642 and shelving elements 1644 upon which module chassis 1606 may be at least partially mounted and structurally supported, the support rails 1646 may extend substantially in parallel to one or more sides of the chassis 1606 on a surface of the shelving 1644. The support rails 1646 may extend along sides of the rack 1640.

The discrete cooling module 1604 may include a set of support rails 1648 that includes a pair of cover support rails 1648 coupled to the discrete cooling module 1604. The cover support rails 1648 may be coupled to one or more various surfaces of the discrete cooling module 1648, including one or more inner surfaces of the air cover 1610, one or more outer surfaces of the air cover 1610, one or more portions of one or more housings 1612 including one or more air moving devices, etc. The pair of cover support rails 1648 may be configured to complementarily couple with corresponding rack support rails 1646. The discrete cooling module 1604 may be slidably coupled to the rack 1640 via coupling of complementary support rails 1646, 1648, and adjusted relative to one or more data storage module chassis 1606, to establish interfaces between corresponding portions of the discrete cooling module 1604 and the data storage module chassis 1606.

In some embodiments, a discrete cooling module 1604 provides vibrational isolation between vibration sources and one or more components included in a data storage module 1602, thereby mitigating vibrational interference with regard to the components. Such a discrete cooling module 1604 may be understood to provide vibrationally-isolated discrete cooling of the data storage module 1602. Vibrational interference may be generated based at least in part upon operation of one or more components, including air moving devices included in housing 1612, that generate vibrations. For example, an air moving device in housing 1612 may include one or more rotating components that, when rotating, generate vibrations through materials comprising the air moving device housing 1612.

Such vibrations may be referred to as rotational vibrations and may be transmitted from the device in which the vibrations are generated to other devices via coupled elements. For example, where a data storage module 1602 includes an air moving device housing 1612 coupled to the chassis 1606 of the module 1602, rotational vibrations generated by the air moving device in the housing 1612 may be transmitted to the chassis 1606 and may propagate, through the chassis 1606, to other components also coupled to the chassis. Such other components may include backplane circuit board assemblies, and mass storage devices installed thereon. Vibrations, including rotational vibrations, that are transmitted to one or more components, including mass storage devices, may interfere with normal operations of the components. The rotational vibrations transmitted to a mass storage device via the chassis may be referred to as rotational vibration interference (RVI) which can interfere with operation of various mechanical components of the storage device, including spinning disks, mechanical controllers, disk readers, etc. Such interference can reduce performance of the mass storage device, which may manifest as reduced I/O operations per second ("IOPS").

In some embodiments, a discrete cooling module 1604 is configured to at least partially isolate various components of one or more devices, which can include mass storage devices 1603 in a data storage module 1602, to which the discrete cooling module 1604 is configured to provide discrete cooling, from various vibrations transmitted through at least a portion of the discrete cooling module 1604. For example, the discrete cooling module 1604 may be configured to isolate mass storage devices 1603 of the data storage module 1602 from vibrations generated by one or more air moving devices in housing 1612 included in the discrete cooling module 1604. Such isolation may be implemented through the indirect coupling of the discrete cooling module 1604 to the chassis of the data storage module 1602 via direct coupling with the rack 1640 via coupling of complementary connectors 1646, 1648. As the discrete cooling module 1604 may be directly coupled to the rack 1640 via complementary connectors 1646, 1648, vibrations generated by the air moving devices in housing 1612 may be transmitted along pathways that proceed through various portions of the discrete cooling module 1604 and to the rack 1640 through the complementary connectors. The vibrations may then propagate through various portions of the rack 1640, including one or more post elements 1642, one or more shelving elements 1644, some combination thereof, or the like. While some vibrations may propagate to the chassis 1606 from the rack 1640, via one or more coupling points, interfaces, etc. between the chassis 1606 and various portions of the rack 1640, the vibrations that do reach the chassis 1606 may be substantially dissipated relative to the vibrations propagating through the discrete cooling module 1604, as the vibrations may be at least partially dissipated through the rack 1640 to one or more external environments, including connections between the rack and various external components, including a floor, various interfaces between the rack and the ambient environment, etc. Although one or more interfaces 1624 may be established between the indirectly coupled discrete cooling module 1604 and chassis 1606, the vibrations may propagate primarily through the direct couplings between the complementary respective connectors 1646, 1648 of the discrete cooling module 1604 and the rack 1640, rather than propagate to the chassis 1606 via the interface 1624. In addition, in some embodiments where a gasket component 1622 is located on one or more portions of the discrete cooling module 1604 and is located at the interface 1624, the gasket component 1622 may at least partially mitigate transmission of vibrations across the interface 1624. For example, the gasket 1622 component may include a shock absorbing material that may mitigate a portion of the vibration, preclude the vibration from propagating across the interface 1624 through the gasket component material, etc.

In some embodiments, one or more of the discrete cooling module 1604 and the chassis 1606 is adjustably positionable, independently of each other, in conjunction with each other, etc., such that a portion of the discrete cooling module 1604 that establishes an interface 1624 with a corresponding portion of the chassis 1606, including gasket component 1622 contacts the portion of the chassis 1606 at an angle, such that sliding contact, shear, etc. between the gasket component 1622 of the discrete cooling module 1604 and the chassis 1606, as the discrete cooling module 1604 is adjustably positioned relative to the chassis 1606, is at least partially mitigated, substantially mitigated, or entirely mitigated, etc.

Figure 17:
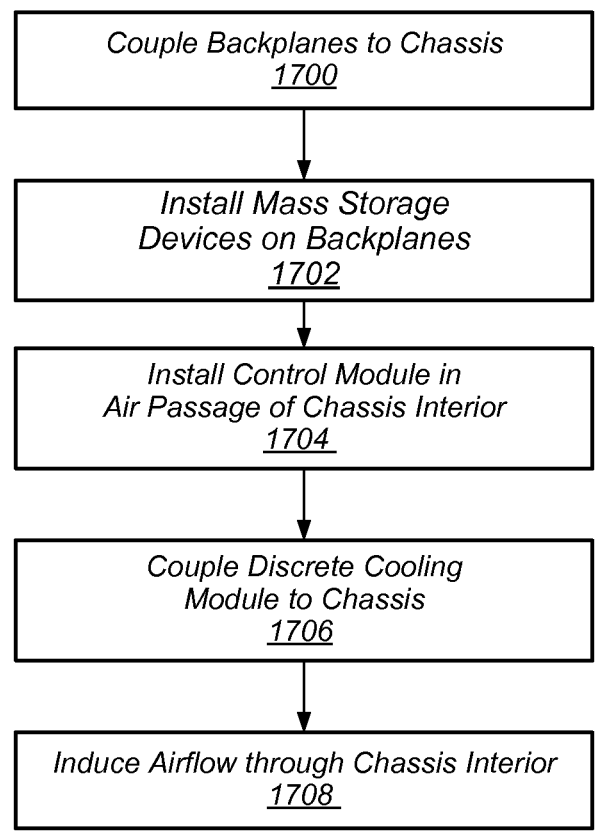
FIG. 17 illustrates a method of providing data storage that includes installing mass storage devices on two or more backplanes coupled to a chassis and installing a data control module in an air passage extending beneath at least one backplane according to some embodiments.

In some embodiments, mass data storage is provided on multiple backplanes in a common chassis, where a data control module is installed in an air passage extending beneath at least one of the backplanes. FIG. 17 illustrates a method of providing data storage that includes installing mass storage devices on two or more backplanes coupled to a chassis and installing a data control module in an air passage extending beneath at least one backplane according to some embodiments. At 1700, two or more backplanes are coupled to a common chassis of a data storage module. The two or more backplanes may each be horizontally-oriented, so that the backplanes are configured to couple with separate mass storage devices on respective upper surfaces of the respective backplanes. At 1702, one or more mass storage devices are installed on at least one of the backplanes. The mass storage devices may be, for example, hard disk drives. The mass storage devices may be in a vertical orientation. Installing a mass storage device on a backplane can include physically coupling an electrical connector of the mass storage device with a complementary electrical connector of the backplane to electrically couple the mass storage device to at least the backplane.

At 1704, a data control module is installed in the data storage module at least partially in an air passage extending beneath at least one of the backplanes in the chassis interior. The air passage may include an air plenum extending through at least a portion of the chassis interior. In some embodiments, one or more data control modules are included in one or more sled modules that are installed ion the data storage module to install the data control modules. The sled modules may be slidably installed via interaction between complementary rail connectors of the sled modules and the chassis. Installation may include coupling a blind mate connector of the data control module with a blind mate connector included in the air passage extending beneath at least one backplane to electrically couple the data control module with the mass storage devices installed on the backplanes. In some embodiments, installation may include coupling a blind mate connector of a sled module that includes one or more data control modules with a blind mate connector included in the air passage extending beneath at least one backplane to electrically couple the data control module with the mass storage devices installed on the backplanes.

At 1706, one or more discrete cooling modules are coupled to the chassis of the data control module. Coupling may include indirectly coupling the discrete cooling module to the chassis via directly coupling the discrete cooling module to a rack to which the chassis is installed. One or more rail connectors of the discrete cooling module may be coupled with complementary corresponding rail connectors of the rack that are coupled to the rack at elevations corresponding to the position of the installed chassis in the rack interior. In some embodiments, coupling includes directly coupling the discrete cooling module to the chassis via complementary rail connectors of an air cover component of the discrete cooling module and a portion of the chassis.

In some embodiments, coupling a discrete cooling module to the chassis, directly or indirectly, includes positioning the discrete cooling module relative to the chassis to establish an interface between various portions of the discrete cooling module, including portions of the air cover, and various portions of the chassis. Positioning the discrete cooling module relative to the chassis may include slidably positioning the discrete cooling module relative to the chassis such that portions of the discrete cooling module that come into contact with corresponding portions of the chassis approach and contact the corresponding portions at an angle, such that sliding contact, shear, etc. between the portions of the discrete cooling module and the chassis in establishing the interface is precluded. Positioning the discrete cooling module relative to the chassis may include slidably positioning the discrete cooling module via sliding interaction between complementary rail connectors via which the discrete cooling module is coupled.

Where the air cover includes one or more gasket components on one or more edges, coupling the discrete cooling module to the chassis may include contacting the gasket components with the chassis, such that the gasket components may seal an interface established between the air cover and one or more portions of the chassis when the discrete cooling module is coupled to the chassis. Sealing the interface may provide additional protection against air leakage from the module at locations other than the intended exhaust ports and may restrict airflow between one or more respective portions of the air cover and the chassis at the interface.

In some embodiments, coupling the discrete cooling module to the chassis includes positioning the discrete cooling module relative to the chassis to position an air moving device included in the discrete cooling module at one or more particular positions in the chassis interior. For example, the discrete cooling module may be positioned, relative to the chassis, to position one or more air moving devices integrated into the structure of the discrete cooling module at one or more particular positions in the chassis interior that are proximate to an exhaust end of the chassis.

At 1708, an airflow through the chassis interior is induced. The air moving devices included in the discrete cooling module may operate to induce a chassis airflow through the chassis interior based at least in part upon an induced pressure gradient between at least a portion of the chassis interior and one or more ambient environments. For example, where a discrete cooling module is coupled to the chassis to position an air moving device proximate to an exhaust end of the chassis, the air moving device may operate to reduce air pressure in at least a portion of the chassis interior, which may establish a pressure gradient from an ambient environment, through an inlet end of the chassis and towards the exhaust end of the chassis, such that an airflow from the ambient environment at the inlet end to the air moving device at the exhaust end is established, thereby inducing a flow of air through at least a portion of the chassis interior from the inlet end towards the exhaust end of the chassis.

In certain embodiments, a computing module includes mass storage devices that are mounted in two or more different orientations. In one embodiment, a computing unit includes one or more mass storage devices mounted in a horizontal orientation and one or more mass storage devices mounted in a vertical orientation.

In some embodiments, mass storage devices in a data storage module are standard, off-the-shelf hard disk drives. Examples of suitable hard disk drive form factors may include 3.5", 5.25", and 2.5". In one embodiment, a standard 3.5" hard disk drive is installed such that the installed height of the hard disk drive is the largest dimension.

In some embodiments, rack-mounted computing modules are commonly cooled by a cooling air system that delivers air to the rack. To remove heat from computing modules installed in the rack, an air handling system may be operated to cause air to flow in computer room and through the rack system. As the air reaches the front of each of computing modules, the air may flow through the chassis of the computing modules. After flowing through the chassis, the heated air may exit the rear of the rack system and flow out of the computer room. In certain embodiments, computing modules may have on board fans in addition to, or lieu of, a central cooling system. In certain embodiments, a rack may have a fan that supplies cooling air to all of the computing modules in the rack.

Although in the embodiments described above, the mass storage devices are mounted on pads and rails, in various embodiments, mass storage devices or other data storage devices may be mounted to a chassis using other mounting elements. For example, mass storage devices and/or backplanes for the disk drives may be mounted on square tubes that support the drives and raise the drives above the bottom of a chassis.

For clarity, modules in many of the figures herein have been shown with a simple box outline around functional components. In various embodiments, a module or a chassis for a module may include an enclosure, a tray, a mounting plate, a combination thereof, as well as various other structural elements.

Although in the embodiments described above, some of the data storage modules have been described as being 3 U and 5 U in height, modules may in various embodiments be 2 U, 4 U, 6 U or any other height or dimensions.

The various methods as illustrated in the Figures and described herein represent example embodiments of methods. The methods may be implemented in software, hardware, or a combination thereof. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A system for storing data, comprising:
a rack;
one or more data storage modules coupled to the rack, a data storage module of the one or more data storage modules comprising:
  a chassis that partially bounds a chassis interior such that the chassis encompasses a front end, opposing side ends, and a bottom end of the chassis interior;
  two or more backplanes coupled to the chassis; and
  one or more mass storage devices coupled to at least one of the backplanes within the chassis interior; and
a discrete cooling module configured to, when coupled to the chassis, enable discrete cooling of the one or more mass storage devices in the chassis of the data storage module, the discrete cooling module comprising:
  at least one air moving device coupled to an air cover, wherein when the discrete cooling module is coupled to the chassis, configuration of the air cover determines a position of the at least one air moving device relative to the chassis;
  the at least one air moving device configured to induce an airflow through the chassis interior of the data storage module, such that the airflow removes heat from at least one heat producing component of each of the one or more mass storage devices in the chassis interior; and
  the air cover configured to:
    bound at least a portion of a top end of the chassis interior that is unbounded by the chassis and direct the airflow through the chassis interior to enable the discrete cooling, and extend above the one or more mass storage devices, between a first vertically-oriented plane defined by an inlet end of the chassis and a second vertically-oriented plane defined by an exhaust end of the chassis when coupled with the chassis.

2. The system of claim 1, wherein:
the at least one air moving device comprises at least one air blower device configured to exhaust air at a different pressure and airflow direction relative to air received into the at least one air blower device; and
to induce an airflow through the chassis interior, the at least one air blower device is configured to reduce air pressure in at least a portion of the chassis interior below an external air pressure of an external environment, such that a flow of air is drawn into the chassis interior from the external environment.

3. The system of claim 1, wherein:
the discrete cooling module is configured to indirectly couple with the data storage module via directly coupling with the rack such that rotational vibrations generated by the at least one air moving device are at least partially isolated from the one or more mass storage devices in the chassis;
the discrete cooling module comprises at least one set of cover rail connectors;
the rack comprises at least one set of rack rail connectors aligned with the one or more data storage modules, wherein each of the at least one set of rack rail connectors are complementary to a corresponding one of the set of cover rail connectors;
to indirectly couple with the data storage module via directly coupling with the rack, the discrete cooling module is configured to directly couple with a portion of the rack via complementary coupling of the cover rail connectors and corresponding rack rail connectors of the rack that are aligned with the data storage module; and
to at least partially isolate rotational vibrations generated by the at least one air moving device from the one or more mass storage devices in the chassis, the discrete cooling module is further configured to transmit at least a portion of the rotational vibrations from the at least one air moving device to the rack via the coupled cover rail connectors and corresponding rack rail connectors, such that the transmitted rotational vibrations is at least partially dissipated through the rack.

4. The system of claim 1, wherein:
the chassis is configured to accommodate the two or more backplanes in a full-depth staggered configuration in the chassis interior; and
to accommodate the two or more backplanes in a full-depth staggered configuration in the chassis interior, the chassis is configured to:
  extend, from the inlet end of the chassis to the exhaust end of the chassis, along an entire depth of an interior of a rack to which the chassis is coupled from an inlet end of the rack to an exhaust end of the rack, such that a power distribution unit is excluded from coupling to the rack to extend into the inlet end of the rack at a common elevation with the chassis in the rack.

5. An apparatus, comprising:
a discrete cooling module configured to provide discrete cooling of heat producing components of a plurality of mass storage devices in an interior space of a particular data storage module, the discrete cooling module comprising:
  at least one air moving device that is configured to induce an air flow through the interior space, from an inlet end of a chassis to an exhaust end of the chassis, wherein the air flow removes heat from the heat producing components and an entirety of the air flow passes between the interior space and an external environment via the at least one air moving device; and an air cover, with which the at least one air moving device is coupled, that is configured to couple with the chassis, wherein the chassis partially encompasses, and supports the plurality of mass storage devices within, the interior space of the particular data storage module, and wherein when the air cover is coupled to the chassis, configuration of the air cover determines a position of the at least one air moving device relative to the chassis;

wherein:

the chassis encompasses a front end, opposing side ends, and a bottom end of the interior space of the particular data storage module, the air cover extends above the plurality of mass storage devices, between a first vertically-oriented plane defined by the inlet end of the chassis and a second vertically-oriented plane defined by the exhaust end of the chassis, and the discrete cooling module is configured to couple with the particular data storage module based at least in part upon the coupling of the air cover with the chassis, such that at least the air cover encompasses at least a portion of a top end of the interior space that is unencompased by the chassis and directs the airflow through the interior space of the particular data storage module to enable discrete cooling.

6. The apparatus of claim 5, wherein:

the at least one air cover is configured to couple with the chassis such that the at least one air moving device is positioned proximate the exhaust end of the chassis to exhaust air into the external environment; and to induce air flow through the interior space, the at least one air moving device is configured to exhaust air from the exhaust end to reduce the air pressure in at least a portion of the interior space with respect to the external air pressure, such that air is drawn into the interior space from the external environment at the inlet end of the chassis based at least in part upon the air pressure difference between the interior space and the external environment.

7. The apparatus of claim 5, wherein:

the discrete cooling module comprises at least one gasket component configured to form a seal at an interface between the air cover and the chassis, such that air flow between the air cover and the chassis is restricted at the interface.

8. The apparatus of claim 7, wherein:

the at least one gasket component is configured to at least partially mitigate transmission of rotational vibrations generated by the air moving device from the air cover to chassis via the interface.

9. The apparatus of claim 5, wherein:

the discrete cooling module comprises at least one set of cover rail connectors; and to couple with a particular data storage module, the discrete cooling module is configured to directly couple with a rack in which the particular data storage module is mounted via complementary coupling of the cover rail connectors with corresponding rack rail connectors of the rack that are aligned with the particular data storage module to indirectly couple the discrete cooling module cover with the particular data storage module.

10. The apparatus of claim 9, wherein:

the discrete cooling module is configured to provide vibrationally-isolated discrete cooling of the particular data storage module; and to provide vibrationally-isolated discrete cooling of the particular data storage module, the discrete cooling module is configured to indirectly couple with the particular data storage module, via complementary coupling of the cover rail connectors with the corresponding rack rail connectors, such that transmission of rotational vibrations generated by the air moving device to the plurality of mass storage devices is restricted to pathways from the discrete cooling module, via at least the complementary coupled cover rail connectors and rack rail connectors, top at least a portion of the rack, such that the rotational vibrations are at least partially dissipated through at least the portion of the rack.

11. The apparatus of claim 9, wherein the discrete cooling module is configured to be slidably translated in the rack at least one of independently of or in conjunction with translation of the particular data storage module in the rack, such that at least a portion of the air cover establishes an interface with a corresponding portion of the chassis of the particular data storage module.

12. The apparatus of claim 11, wherein:

to establish the interface with the corresponding portion of the chassis of the particular data module, the discrete cooling module is configured to contact the corresponding portion of the chassis at an angle to at least partially mitigate shearing contact between the discrete cooling module and the chassis of the particular data storage module.

13. The apparatus of claim 5, wherein:

the particular data storage module comprises one or more common power supply units configured to supply electrical power to at least one of the plurality of mass storage devices in the interior space of the particular data storage module; and the discrete cooling module is configured to supply power from the one or more common power supply units to the at least one air moving device, such that the at least one air moving device receives operating power from the one or more common power supply units.

14. The apparatus of claim 5, wherein:

the particular data storage module comprises a plurality of backplanes coupled to the chassis in a staggered configuration, such that one of the plurality of backplanes that is coupled to the chassis proximate to the inlet end is elevated relative to another one of the plurality of backplanes that is coupled to the chassis proximate to the exhaust end;

at least one of the plurality of mass storage devices is coupled to each of the plurality of backplanes; and the discrete cooling module is configured to couple with the particular data storage module, such that:

the at least one air moving device is positioned proximate to the exhaust end of the chassis and above at least one mass storage device of the one of the plurality of backplanes that is coupled to the chassis proximate to the exhaust end; and the at least one air moving device is positioned at an elevation that is common with at least a portion of at least one mass storage device of the other one of the plurality of backplanes that is coupled to the chassis proximate to the inlet end.

15. A method, comprising:
configuring a discrete cooling module to provide discrete cooling to a particular data storage module coupled to a rack, wherein:
- the discrete cooling module comprises an air cover, wherein the air cover is coupled with an air moving device that is configured to induce an airflow, and the air cover is coupled with a chassis that partially encompasses, and supports a plurality of mass storage devices within, an interior space of the particular data storage module, wherein:
  - the chassis encompasses a front end, opposing side ends, and a bottom end of the interior space of the particular data storage module;
  - the air cover extends above the plurality of mass storage devices, between a first vertically-oriented plane defined by an inlet end of the chassis and a second vertically-oriented plane defined by an exhaust end of the chassis; and
  - when the air cover is coupled to the chassis, configuration of the air cover determines a position of the at least one air moving device relative to the chassis; and
configuring the discrete cooling module to provide discrete cooling to the particular data storage module comprises coupling the discrete cooling module to the particular data storage module based at least in part upon coupling of the air cover with the chassis, such that at least the air cover encompasses at least a portion of a top end of the interior space that is unencompassed by the chassis and directs the airflow through the interior space of the particular data storage module to enable discrete cooling.

16. The method of claim 15, wherein:
configuring the discrete cooling module to provide discrete cooling to a particular data storage module in a rack comprises configuring the discrete cooling module to provide vibrationally-isolated discrete cooling of the particular data storage module; and
configuring the discrete cooling module to provide vibrationally-isolated discrete cooling of the particular data storage module comprises indirectly coupling the discrete cooling module with the particular data storage module via directly coupling the discrete cooling module with at least a portion of the rack to which the particular data storage module is coupled, such that transmission of rotational vibrations generated by the air moving device to the plurality of mass storage devices is restricted to pathways from the discrete cooling module to the particular data storage module via at least a portion of the rack, such that the rotational vibrations are at least partially dissipated through at least the portion of the rack.

17. The method of claim 16, wherein:
the discrete cooling module comprises at least one set of cover rail connectors; and
indirectly coupling the discrete cooling module with the particular data storage module via directly coupling the discrete cooling module with at least a portion of rack comprises slidably coupling the cover rail connectors of the discrete cooling module with corresponding complementary rack rail connectors of the rack that are aligned with the particular data storage module.

18. The method of claim 17, wherein:
indirectly coupling the discrete cooling module with the particular data storage module via directly coupling the discrete cooling module with the rack further comprises slidably adjusting a position of the discrete cooling module along the corresponding complementary rack rail connectors, independently of the particular data storage module, such that at least a portion of the air cover establishes an interface with a corresponding portion of the chassis of the particular data storage module.

19. The method of claim 18, wherein:
the discrete cooling module comprises at least one gasket component at an edge of the air cover; and
slidably adjusting a position of the discrete cooling module further comprises establishing a seal between at least the edge of the air cover and the corresponding portion of the chassis via the at least one gasket component, such that air flow between the air cover and the chassis is restricted at the interface.

20. The method of claim 15, wherein:
the air moving device comprises at least one air blower device configured to exhaust air at a different pressure and airflow direction relative to air received into the at least one air blower device; and
to induce air flow through the interior space, the at least one air blower device is configured to induce an air pressure difference between at least a portion of the interior space and the external environment, such that the air flow through the interior space is induced based at least in part upon the induced air pressure difference.

* * * * *